US011950423B2

(12) United States Patent
Lee et al.

(10) Patent No.: US 11,950,423 B2
(45) Date of Patent: Apr. 2, 2024

(54) SEMICONDUCTOR DEVICE AND ELECTRONIC SYSTEM INCLUDING THE SAME

(71) Applicant: Samsung Electronics Co., Ltd., Suwon-si (KR)

(72) Inventors: Yongkyu Lee, Gwacheon-si (KR);
Youngmok Kim, Yongin-si (KR);
Changmin Jeon, Yongin-si (KR);
Yongsang Jeong, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 255 days.

(21) Appl. No.: 17/306,308

(22) Filed: May 3, 2021

(65) Prior Publication Data
US 2022/0085048 A1 Mar. 17, 2022

(30) Foreign Application Priority Data
Sep. 17, 2020 (KR) .................. 10-2020-0120039

(51) Int. Cl.
*H01L 27/11573* (2017.01)
*H01L 23/00* (2006.01)
(Continued)

(52) U.S. Cl.
CPC ............. *H10B 43/40* (2023.02); *H01L 24/08* (2013.01); *H01L 24/80* (2013.01);
(Continued)

(58) Field of Classification Search
CPC .............. H10B 43/40; H10B 20/00–10; H10B 20/27–50; H10B 41/00–70;
(Continued)

(56) References Cited

U.S. PATENT DOCUMENTS 8,237,228 B2 8/2012 Or-Bach et al.
8,476,700 B2 7/2013 Kim et al.
(Continued)

OTHER PUBLICATIONS

"Yangtze Memory Technologies Co., Ltd. (YMTC)'s Trump Card: Detailed Description on the Structure of Xtacking" Semiconductor Industry Sights (Foreign Text, 8 pages; English Translation, 11 pages) (Sep. 17, 2018).

(Continued)

*Primary Examiner* — Cuong B Nguyen
(74) *Attorney, Agent, or Firm* — Myers Bigel, P.A.

(57) ABSTRACT

A semiconductor device includes: a cell area including a cell substrate, a memory cell array, and a first bonding metal pad on the memory cell array, the memory cell array including a plurality of word lines stacked on the cell substrate and a plurality of bit lines on the plurality of word lines; and a peripheral circuit area having the cell area stacked thereon and including a peripheral circuit substrate, a plurality of circuits on the peripheral circuit substrate, and a second bonding metal pad bonded to the first bonding metal pad, wherein the plurality of circuits include: a plurality of planar channel transistors respectively including a channel along a top surface of the peripheral circuit substrate; and at least one recess channel transistor including a channel along a surface of a recess trench arranged in the peripheral circuit.

20 Claims, 29 Drawing Sheets

(51) Int. Cl.
*H01L 25/00* (2006.01)
*H01L 25/065* (2023.01)
*H01L 25/18* (2023.01)
*H10B 41/27* (2023.01)
*H10B 41/41* (2023.01)
*H10B 43/27* (2023.01)
*H10B 43/40* (2023.01)

(52) U.S. Cl.
CPC .......... *H01L 25/0657* (2013.01); *H01L 25/18* (2013.01); *H01L 25/50* (2013.01); *H10B 41/27* (2023.02); *H10B 41/41* (2023.02); *H10B 43/27* (2023.02); *H01L 2224/08145* (2013.01); *H01L 2224/80895* (2013.01); *H01L 2224/80896* (2013.01); *H01L 2924/1431* (2013.01); *H01L 2924/14511* (2013.01)

(58) Field of Classification Search
CPC .............. H10B 43/00–50; H10B 53/20; H10B 43/35; H10B 69/00; H01L 24/08; H01L 24/80; H01L 25/0657; H01L 25/18; H01L 25/50; H01L 2224/08145; H01L 2224/80895; H01L 2224/80896; H01L 2924/1431; H01L 2924/14511; H01L 2225/06527; H01L 2225/06541; H01L 2225/06575; H01L 2225/06568; H01L 21/823456; H01L 27/088; H01L 21/823462; H01L 24/05; H01L 23/5226; H01L 27/1024; H01L 27/2463; H01L 27/2481; H01L 29/4234–42352; H01L 29/42324–42336; H01L 29/788–7889; H01L 29/792–7926; H01L 2924/145; H01L 2924/1451; H01L 2924/1453; G11C 16/08; G11C 16/0483; G11C 11/5621–5642; G11C 16/02; G11C 16/0466–0475; G11C 16/0408–0458; G11C 2216/06–10; G11C 2216/12–30; G11C 27/005

See application file for complete search history.

(56) References Cited

U.S. PATENT DOCUMENTS

| | | | |
|---|---|---|---|
| 9,093,500 | B2 | 7/2015 | Park et al. |
| 9,478,487 | B2 | 10/2016 | Yang et al. |
| 10,651,153 | B2 | 5/2020 | Fastow et al. |
| 10,685,708 | B2 | 6/2020 | Jeon et al. |
| 2007/0115725 | A1 | 5/2007 | Pham et al. |
| 2009/0020807 | A1* | 1/2009 | Yoon ................ H01L 21/28167 438/282 |
| 2011/0109828 | A1 | 5/2011 | Kim et al. |
| 2014/0110777 | A1* | 4/2014 | Peng ................... H01L 29/7809 257/330 |
| 2018/0286960 | A1* | 10/2018 | Huo .................... H01L 29/0653 |
| 2020/0091185 | A1 | 3/2020 | Baek |
| 2020/0185400 | A1 | 6/2020 | Park et al. |
| 2020/0185402 | A1 | 6/2020 | Son et al. |
| 2021/0335784 | A1* | 10/2021 | Yang ................... H01L 29/6681 |
| 2022/0059481 | A1* | 2/2022 | Shibata .................. H01L 25/18 |
| 2022/0085041 | A1* | 3/2022 | Wu .................. H01L 29/40117 |

OTHER PUBLICATIONS

"Yangtze Memory Technologies Introduces New 3D Nand Architecture—Xtacking™" Yangtze Memory Technologies Co., Ltd (Aug. 6, 2018).

Bae, JH "Samsung's 3D V-NAND breaks through chip scaling limits" Korea Industry Post (5 pages) (Feb. 14, 2014).

Fan et al. "Low Temperature Wafer-Level Metal Thermo-Compression Bonding Technology for 3D Integration" Metallurgy, Chapter 4 (pp. 71-94) (Sep. 19, 2012).

Hattori, Takeshi "YMTC's Idea for 3D NAND Market Capture—"Xtacking"" (Foreign Text, 3 pages; English Translation, 6 pages) (Jan. 31, 2019).

* cited by examiner

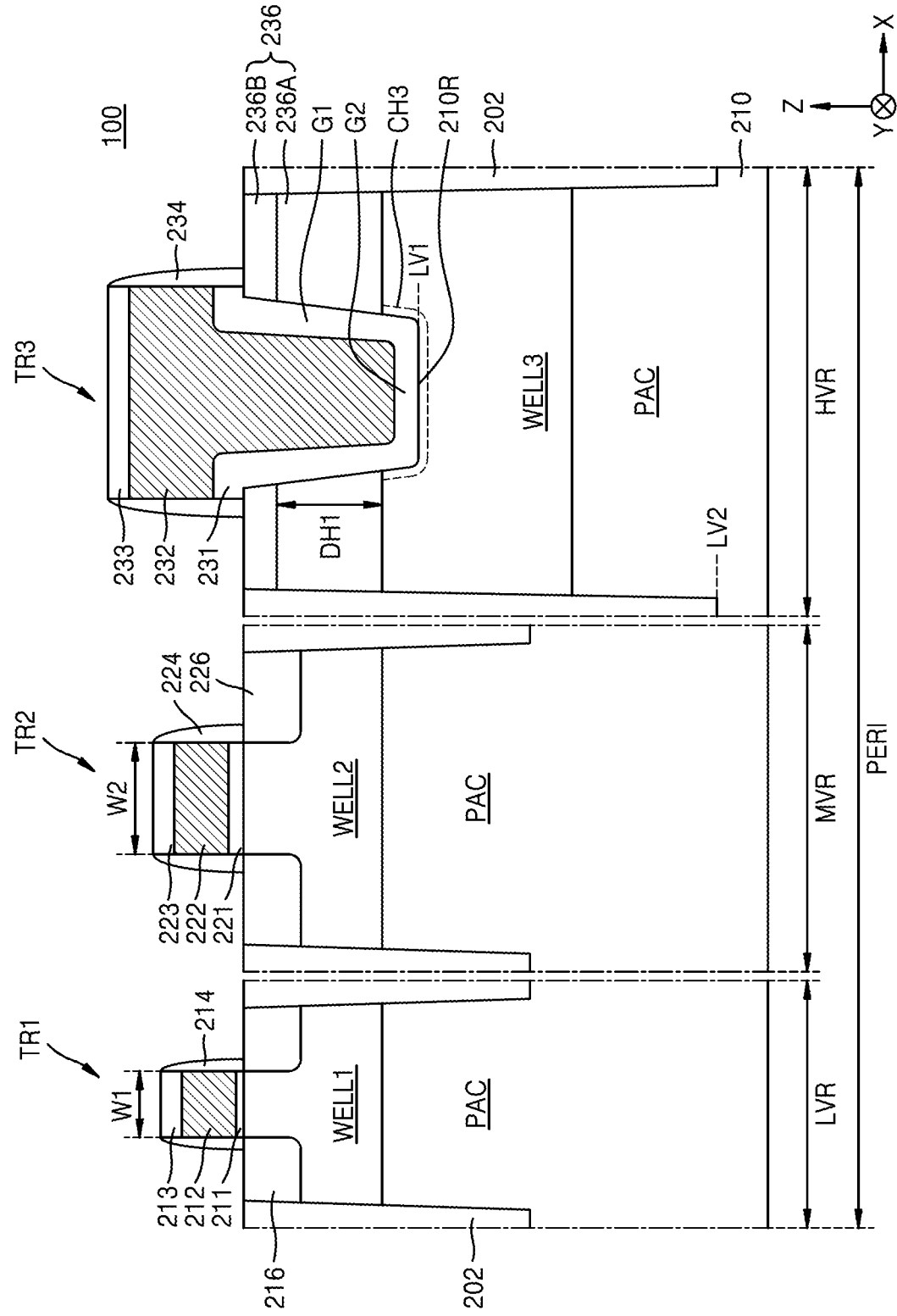

SEMICONDUCTOR DEVICE AND ELECTRONIC SYSTEM INCLUDING THE SAME

CROSS-REFERENCE TO RELATED APPLICATION

This application is based on and claims priority under 35 U.S.C. § 119 to Korean Patent Application No. 10-2020-0120039, filed on Sep. 17, 2020, in the Korean Intellectual Property Office, the disclosure of which is incorporated by reference herein in its entirety.

FIELD

The inventive concept relates to a semiconductor device and an electronic system including the semiconductor device, and more particularly, to a semiconductor device including a non-volatile vertical memory device and an electronic system including the semiconductor device.

BACKGROUND

Semiconductor devices capable of storing a large amounts of data may be desired to meet data storage needs of electronic systems. Therefore, to increase data storage capacities of semiconductor devices, semiconductor devices including vertical memory devices, which include three-dimensionally arranged memory cells, have been proposed.

SUMMARY

The inventive concept provides a semiconductor device having a structure advantageous for high integration and planar size reduction by suppressing an increase in area occupied by a peripheral circuit area, even when, in the semiconductor device including three-dimensionally arranged memory cells, the number of stacks of word lines and the number of transistors connected to the memory cells are increased to improve the degree of integration.

The inventive concept also provides an electronic system including a semiconductor device, which has a structure advantageous for high integration and planar size reduction by suppressing an increase in area occupied by a peripheral circuit area, even when, in the semiconductor device including three-dimensionally arranged memory cells, the number of stacks of word lines and the number of transistors connected to the memory cells are increased to improve the degree of integration.

According to an aspect of the inventive concept, there is provided a semiconductor device including: a cell area including a cell substrate, a memory cell array, and a first bonding metal pad on the memory cell array, the memory cell array including a plurality of word lines stacked in a vertical direction on the cell substrate and a plurality of bit lines on the plurality of word lines; and a peripheral circuit area having the cell area stacked thereon in the vertical direction, the peripheral circuit area including a peripheral circuit substrate, a plurality of circuits on the peripheral circuit substrate, and a second bonding metal pad bonded to the first bonding metal pad, wherein the plurality of circuits include: a plurality of planar channel transistors respectively including a channel region along a top surface of the peripheral circuit substrate; and at least one recess channel transistor including a channel region along a surface of a recess trench in the peripheral circuit substrate.

According to another aspect of the inventive concept, there is provided a semiconductor device including: a cell area including a memory cell array; and a peripheral circuit area having the cell area stacked thereon in a vertical direction, the peripheral circuit area including a peripheral circuit substrate and a plurality of circuits on the peripheral circuit substrate and electrically connected to the memory cell array, wherein the plurality of circuits include: a plurality of planar channel transistors respectively including a channel region along a top surface of the peripheral circuit substrate; and at least one recessed channel transistor including a channel region along a surface of a recess trench in the peripheral circuit substrate.

According to yet another aspect of the inventive concept, there is provided an electronic system including: a main substrate; a semiconductor device on the main substrate; and a controller on the main substrate, the controller being electrically connected to the semiconductor device, wherein the semiconductor device includes: a cell area including a memory cell array; a peripheral circuit area having the cell area stacked thereon in a vertical direction, the peripheral circuit area including a peripheral circuit substrate and a plurality of circuits on the peripheral circuit substrate and electrically connected to the memory cell array, and wherein the plurality of circuits include: a plurality of planar channel transistors respectively including a channel region along a top surface of the peripheral circuit substrate; and at least one recess channel transistor including a channel region along a surface of a recess trench in the peripheral circuit substrate.

BRIEF DESCRIPTION OF THE DRAWINGS

Embodiments of the inventive concept will be more clearly understood from the following detailed description taken in conjunction with the accompanying drawings in which:

FIG. 7C is a cross-sectional view illustrating some components of a peripheral circuit area of the semiconductor device shown in FIG. 7A;

DETAILED DESCRIPTION OF EMBODIMENTS

Figure 1:
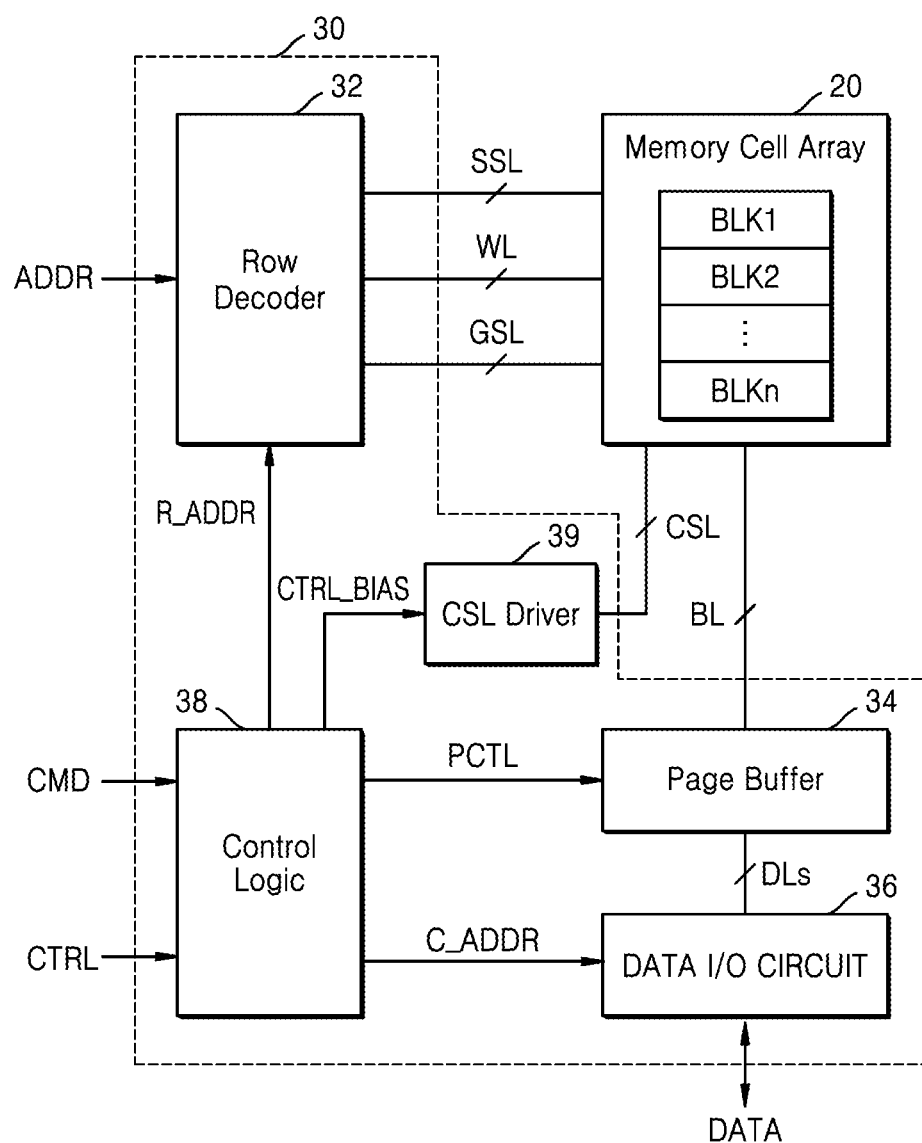
FIG. 1 is a block diagram of a semiconductor device according to embodiments of the inventive concept.

Hereinafter, embodiments of the inventive concept will be described in detail with reference to the accompanying drawings. Like components will be denoted by like reference numerals throughout the specification, and repeated descriptions thereof are omitted. The terms "first," "second," etc. are used herein merely to distinguish one element from another.

FIG. 1 is a block diagram of a semiconductor device 10 according to embodiments of the inventive concept.

Referring to FIG. 1, the semiconductor device 10 may include a memory cell array 20 and a peripheral circuit 30. The memory cell array 20 includes a plurality of memory cell blocks BLK1, BLK2, . . . , and BLKn. Each of the plurality of memory cell blocks BLK1, BLK2, . . . , and BLKn may include a plurality of memory cells. The memory cell blocks BLK1, BLK2, . . . , and BLKn may be connected to the peripheral circuit 30 via a bit line BL, a word line WL, a string select line SSL, and a ground select line GSL.

The peripheral circuit 30 may include a row decoder 32, a page buffer 34, a data input/output circuit 36, a control logic 38, and a common source line driver 39. The peripheral circuit 30 may further include various circuits such as a voltage generation circuit that may be used for generating various voltages required for operations of the semiconductor device 10, an error correction circuit for correcting errors in data read from the memory cell array 20, and an input/output interface.

The memory cell array 20 may be connected to the row decoder 32 via the word line WL, the string select line SSL, and the ground select line GSL and may be connected to the page buffer 34 via the bit line BL. In the memory cell array 20, each of the plurality of memory cells included in the plurality of memory cell blocks BLK1, BLK2, . . . , and BLKn may include a flash memory cell. The memory cell array 20 may include a 3-dimensional memory cell array. The 3-dimensional memory cell array may include a plurality of NAND strings, and each of the plurality of NAND strings may include a plurality of memory cells connected to a plurality of word lines WL vertically stacked.

The peripheral circuit 30 may receive an address ADDR, a command CMD, and a control signal CTRL from outside the semiconductor device 10 and may transmit data DATA to and receive data DATA from a device external to the semiconductor device 10.

The row decoder 32 may select at least one of the plurality of memory cell blocks BLK1, BLK2, . . . , and BLKn in response to the address ADDR from outside the semiconductor device 10 and may select the word line WL, the string select line SSL, and the ground select line GSL of the selected memory cell block. The row decoder 32 may transfer a voltage for performing a memory operation to the word line WL of the selected memory cell block.

The page buffer 34 may be connected to the memory cell array 20 via the bit line BL. The page buffer 34 may apply a voltage according to the data DATA intended to be stored in the memory cell array 20 to the bit line BL by operating as a write driver during a program operation and may sense the data DATA stored in the memory cell array 20 by operating as a sense amplifier during a read operation. The page buffer 34 may be operated according to a control signal PCTL provided by the control logic 38.

The data input/output circuit 36 may be connected to the page buffer 34 via a plurality of data lines DLs. The data input/output circuit 36 may receive the data DATA from a memory controller during the program operation and may provide the programmed data DATA to the page buffer 34 based on a column address C_ADDR provided by the control logic 38. The data input/output circuit 36 may provide the read data DATA stored in the page buffer 34 to the memory controller, based on the column address C_ADDR provided by the control logic 38, during the read operation.

The data input/output circuit 36 may transfer an address or a command, which is input thereto, to the control logic 38 or the row decoder 32. The peripheral circuit 30 may further include an electrostatic discharge (ESD) circuit and a pull-up/pull-down driver.

The control logic 38 may receive the command CMD and the control signal CTRL from the memory controller. The control logic 38 may provide a row address R_ADDR to the row decoder 32 and may provide the column address C_ADDR to the data input/output circuit 36. The control logic 38 may generate various internal control signals, which are used in the semiconductor device 10, in response to the control signal CTRL. For example, the control logic 38 may adjust a level of a voltage provided to the word line WL and the bit line BL, when a memory operation such as a program operation or an erase operation is performed.

The common source line driver 39 may be connected to the memory cell array 20 via a common source line CSL. The common source line driver 39 may apply a common source voltage (for example, a power supply voltage) or a ground voltage to the common source line CSL, based on control by the control logic 38.

In example embodiments, the peripheral circuit 30 may include a plurality of MOS (metal-oxide-semiconductor) transistors, and the plurality of MOS transistors may be classified according to magnitudes of operation voltages thereof and thus dispersively arranged in a plurality of transistor areas. For example, the peripheral circuit 30 may include a low-voltage area, in which a plurality of low-voltage MOS transistors are formed, and a high-voltage area, in which a plurality of high-voltage MOS transistors are formed. In addition, the peripheral circuit 30 may include various areas that include MOS transistors having operation voltages greater than an operation voltage of a MOS transistor arranged in the low-voltage area and less than an operation voltage of a MOS transistor arranged in the high-voltage area.

Figure 2:
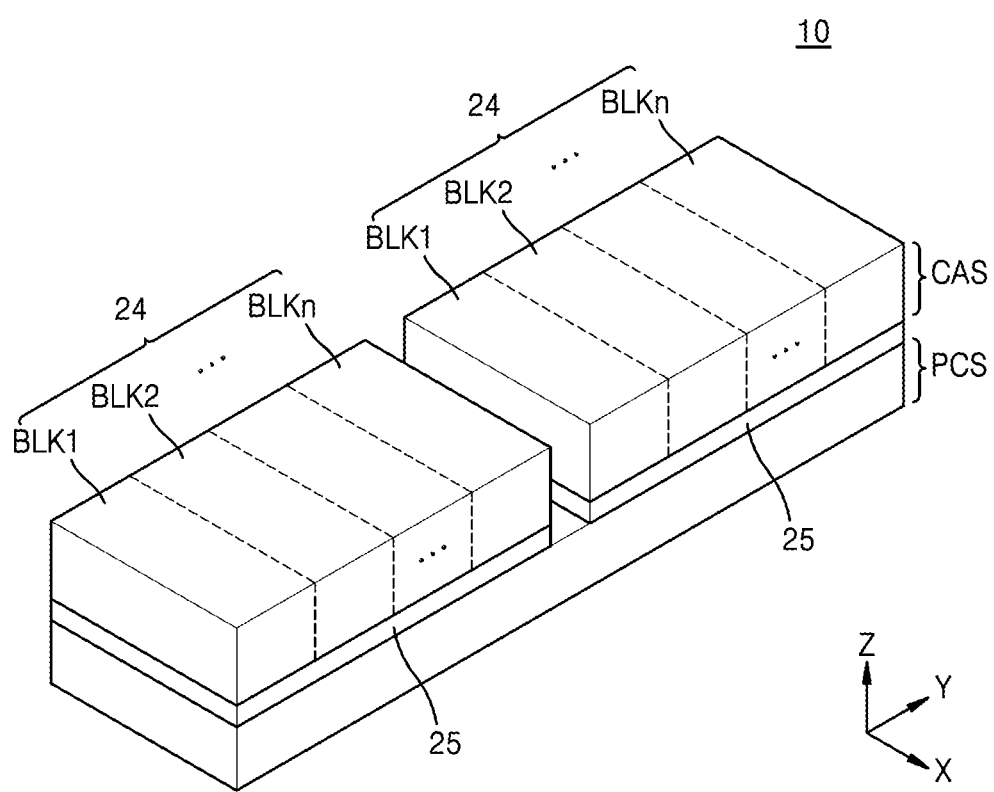
FIG. 2 is a schematic perspective view of a semiconductor device according to embodiments of the inventive concept.

FIG. 2 is a schematic perspective view of the semiconductor device 10 according to embodiments of the inventive concept.

Referring to FIG. 2, the semiconductor device 10 includes a cell array structure CAS and a peripheral circuit structure PCS, which overlap (e.g., are stacked on) each other in a vertical direction (Z direction). The cell array structure CAS may include the memory cell array 20 described with reference to FIG. 1. The peripheral circuit structure PCS may include the peripheral circuit 30 described with reference to FIG. 1. In example embodiments, the peripheral circuit structure PCS may include a low-voltage area, in which a plurality of low-voltage MOS transistors are formed, and a high-voltage area, in which a plurality of high-voltage MOS transistors are formed. In addition, the peripheral circuit structure PCS may include various regions that include MOS transistors having operation voltages greater than an operation voltage of a MOS transistor arranged in the low-voltage area and less than an operation voltage of a MOS transistor arranged in the high-voltage area. The low-voltage area, the high-voltage area, and/or the various regions may be arranged laterally adjacent to one another in a horizontal direction (e.g., in the X or Y direction).

A connection structure 25 may be arranged between the cell array structure CAS and the peripheral circuit structure PCS. The cell array structure CAS and the peripheral circuit structure PCS may be stacked in the vertical direction (Z direction) via the connection structure 25. The connection structure 25 may provide physical connection and electrical connection between the cell array structure CAS and the peripheral circuit structure PCS. Electrical connection and data transfer between the cell array structure CAS and the peripheral circuit structure PCS may be made via the connection structure 25. The connection structure 25 may include a plurality of connection units for electrically connecting the cell array structure CAS to the peripheral circuit structure PCS. The plurality of connection units may include a metal-metal bonding structure, a through-silicon via (TSV), a back via stack (BVS), a eutectic bonding structure, a ball grid array (BGA) bonding structure, a plurality of wiring lines, a plurality of contact plugs, or a combination thereof. In example embodiments, the metal-metal bonding structure may include copper (Cu), aluminum (Al), tungsten (W), or a combination thereof.

The cell array structure CAS may include a plurality of tiles 24. Each of the plurality of tiles 24 may include the plurality of memory cell blocks BLK1, BLK2, . . . , and BLKn. Each of the plurality of memory cell blocks BLK1, BLK2, . . . , and BLKn may include three-dimensionally arranged memory cells. In example embodiments, two tiles 24 may constitute, but is not limited to, one mat. The memory cell array 20 described with reference to FIG. 1 may include, but is not limited to, a plurality of mats, for example, four mats.

Figure 3:
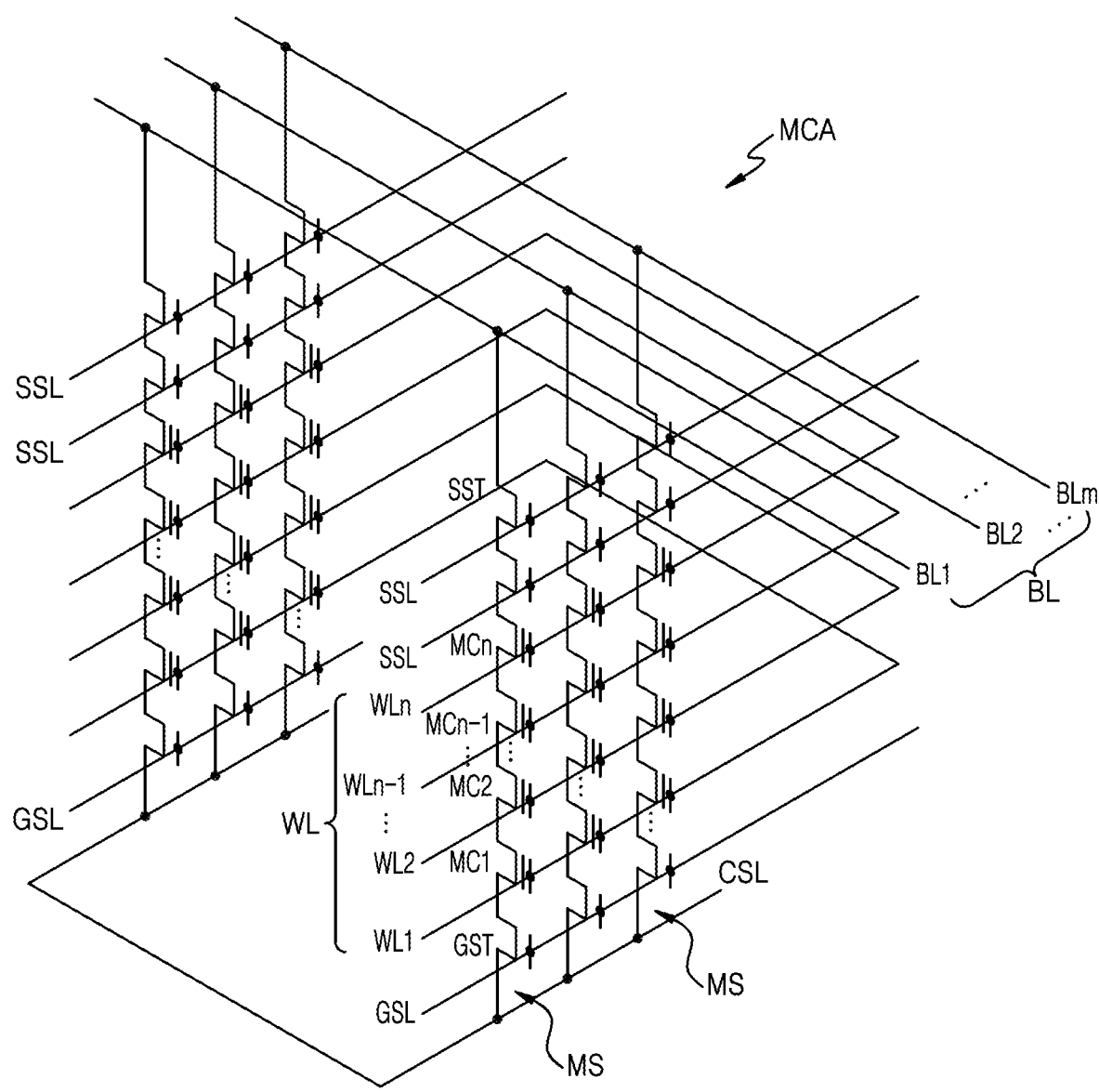
FIG. 3 is an equivalent circuit diagram of a memory cell array of a semiconductor device, according to embodiments of the inventive concept.

FIG. 3 is an equivalent circuit diagram of a memory cell array MCA of a semiconductor device, according to embodiments of the inventive concept. FIG. 3 illustrates an example of an equivalent circuit diagram of a vertical NAND flash memory device having a vertical channel structure. Each of the plurality of memory cell blocks BLK1, BLK2, . . . , and BLKn shown in FIGS. 1 and 2 may include the memory cell array MCA having a circuit configuration shown in FIG. 3.

Referring to FIG. 3, the memory cell array MCA may include a plurality of memory cell strings MS. The memory cell array MCA may include a plurality of bit lines BL (that is, BL1, BL2, . . . , and BLm), a plurality of word lines WL (that is, WL1, WL2, . . . , WLn−1, and WLn), at least one string select line SSL, at least one ground select line GSL, and a common source line CSL. The plurality of memory cell strings MS may be formed between the plurality of bit lines BL and the common source line CSL. Although FIG. 3 illustrates an example in which each of the plurality of memory cell strings MS includes one ground select line GSL and two string select lines SSL, the inventive concept is not limited thereto. For example, each of the plurality of memory cell strings MS may include one string select line SSL.

Each of the plurality of memory cell strings MS may include a string select transistor SST, a ground select transistor GST, and a plurality of memory cell transistors MC1, MC2, . . . , MCn−1, and MCn. A drain region of the string select transistor SST may be connected to the bit line BL, and a source region of the ground select transistor GST may be connected to the common source line CSL. The common source line CSL may be a region to which source regions of a plurality of ground select transistors GST are connected in common.

The string select transistor SST may be connected to the string select line SSL, and the ground select transistor GST may be connected to the ground select line GSL. Each of the plurality of memory cell transistors MC1, MC2, . . . , MCn−1, and MCn may be connected to a word line WL.

Figure 4:
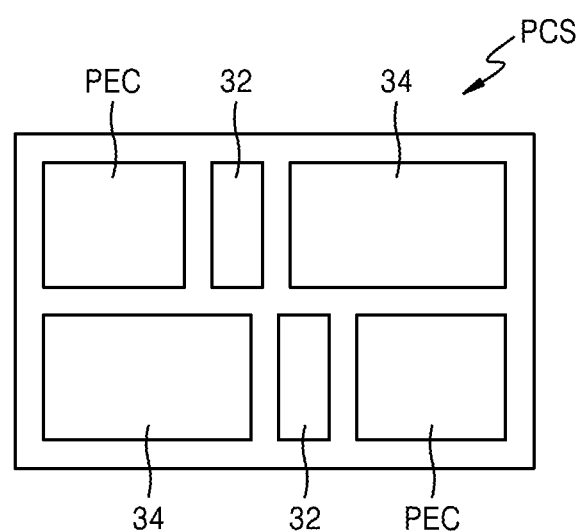
FIG. 4 is a schematic layout illustrating an example planar arrangement in a portion of a peripheral circuit structure of a semiconductor device, according to embodiments of the inventive concept.

FIG. 4 is a schematic layout illustrating an example planar arrangement in a portion of the peripheral circuit structure PCS of the semiconductor device 10, according to embodiments of the inventive concept.

Referring to FIG. 4, the peripheral circuit structure PCS may include row decoders 32, page buffers 34, and a plurality of peripheral circuits PEC. The plurality of peripheral circuits PEC may include various circuits included in the peripheral circuit 30 shown in FIG. 1. For example, the plurality of peripheral circuits PEC may include the data input/output circuit 36, the control logic 38, a voltage generator for generating a word line voltage, a latch circuit, a cache circuit, a sense amplifier, an ESD device, and the like. In example embodiments, the data input/output circuit 36 may be arranged in peripheral areas of the plurality of peripheral circuits PEC. The page buffers 34 and the plurality of peripheral circuits PEC may be arranged in a location stacked on or otherwise overlapping the memory cell array 20 (see FIG. 1) in the vertical direction. The planar layout shown in FIG. 4 is merely an example, and various modifications and changes may be made thereto without departing from the spirit and scope of the inventive concept.

Figure 5:
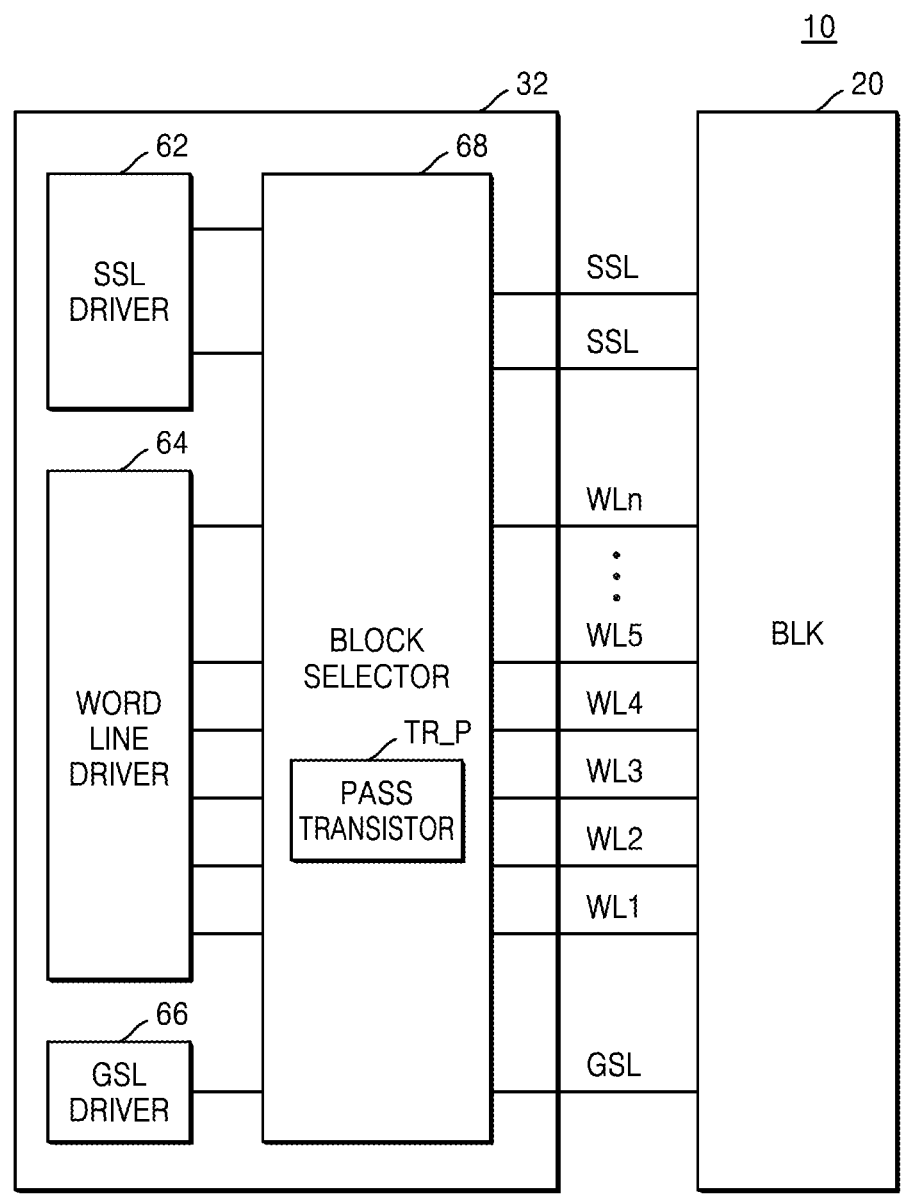
FIG. 5 is a block diagram illustrating an example configuration of a memory cell array and a row decoder, which are shown in FIG. 1.

FIG. 5 is a block diagram illustrating an example configuration of the memory cell array 20 and the row decoder 32, which are shown in FIG. 1.

Referring to FIG. 5, the memory cell array 20 includes a memory cell block BLK. The memory cell block BLK may be one of the plurality of memory cell blocks BLK1, BLK2, . . . , and BLKn shown in FIG. 2.

Referring to FIG. 5, the row decoder 32 may include a string select line driver 62, a word line driver 64, a ground select line driver 66, and a block selector 68. The block selector 68 may decode at least some bits of a received address and thus select a corresponding memory cell block BLK. The block selector 68 may be arranged between the plurality of memory cell blocks BLK1, BLK2, . . . , and BLKn (see FIG. 2) and the string select line driver 62, the word line driver 64, and the ground select line driver 66.

The string select line driver 62 may be connected to the string select line SSL via the block selector 68 and thus drive the string select line SSL. For example, during the erase operation, the string select line driver 62 may float the string select line SSL, and during a program operation, the string select line driver 62 may provide a string select voltage (for example, a power supply voltage) at a high voltage level to the string select line SSL.

The word line driver 64 may be connected to a plurality of word lines WL1, WL2, WLn−1, and WLn via the block selector 68 and thus drive the plurality of word lines WL1, WL2, . . . , WLn−1, and WLn. For example, during the erase operation, an erase voltage at a high voltage level may be applied to a bulk region in which the memory cell block BLK is formed, and the word line driver 64 may apply a word line voltage (for example, a ground voltage) at a relatively low level to the plurality of word lines WL1, WL2, . . . , WLn−1, and WLn. In addition, during the program operation, the word line driver 64 may provide a program voltage at a high level to a selected word line and may provide a pass voltage to an unselected word line.

The ground select line driver 66 may drive the ground select line GSL via the block selector 68. For example, during the erase operation, the ground select line driver 66 may float the ground select line GSL, and during the program operation, the ground select line driver 66 may provide a ground select voltage (for example, a ground voltage) at a low level to the ground select line GSL.

The block selector 68 may include a plurality of pass transistors TR_P. Based on switching operations of the plurality of pass transistors TR_P, a row line voltage applied to row lines, that is, the ground select line GSL, the string select line SSL, and the plurality of word lines WL1, WL2, . . . , WLn−1, and WLn, may be controlled. The memory cell array 20 of the memory device 10 may include a gate stack including a plurality of gate lines, for example, a gate stack GS including a plurality of gate lines 130 shown in FIGS. 6 and 7B, and each of the plurality of pass transistors TR_P may switch a row line voltage applied to each of the plurality of gate lines constituting one memory cell block BLK.

In example embodiments, at least one of the string select line driver 62, the word line driver 64, the ground select line driver 66, and the block selector 68, which are included in the row decoder 32, may include a high-voltage MOS transistor having a relatively high operation voltage of about 10 V or more.

Figure 6:
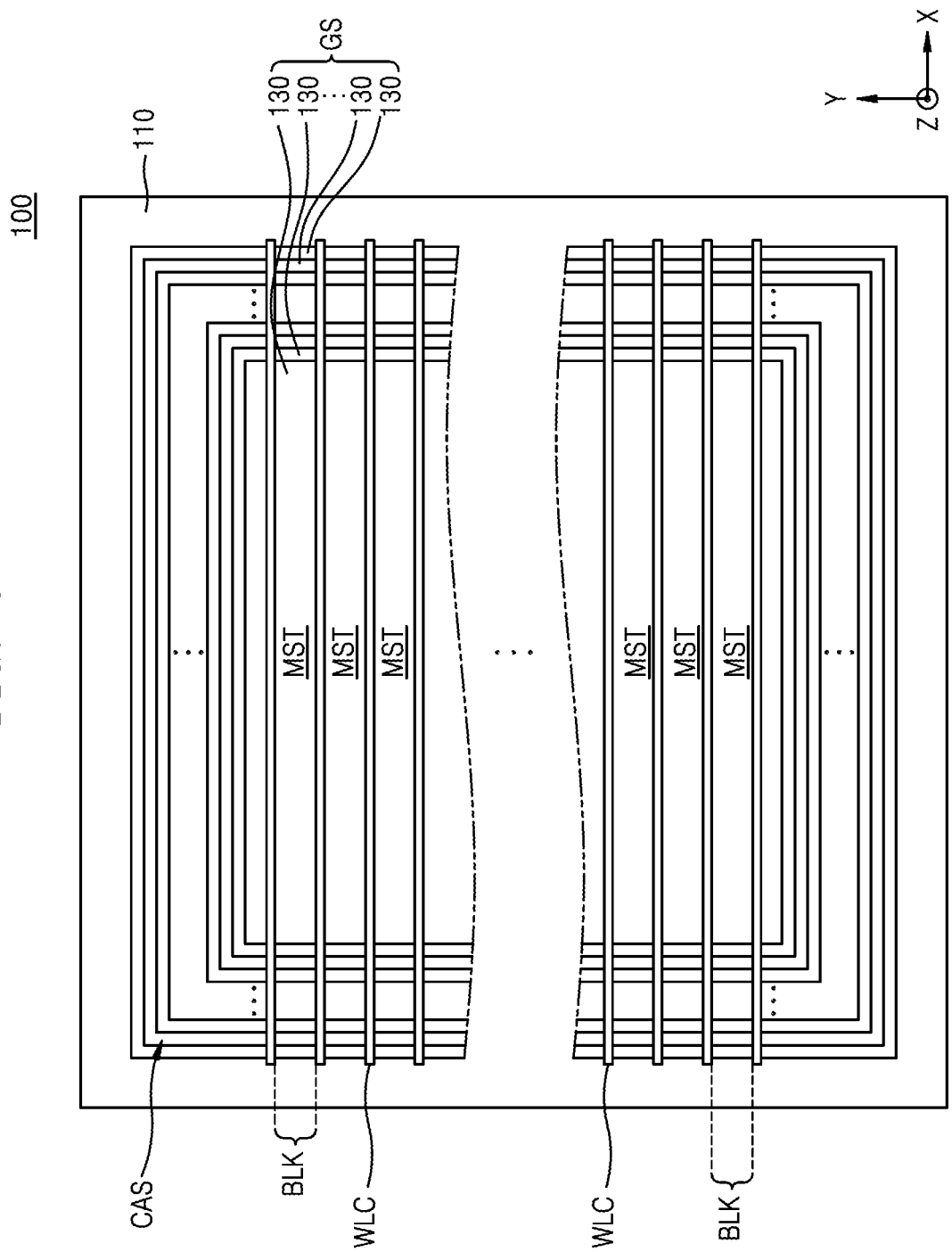
FIG. 6 is a schematic plan view of a portion of a semiconductor device, according to embodiments of the inventive concept.

FIG. 6 is a schematic plan view of a portion of the semiconductor device 100, according to embodiments of the inventive concept.

Referring to FIG. 6, the semiconductor device 100 may include the cell array structure CAS arranged on a conductive plate 110. The conductive plate 110 and the cell array structure CAS may constitute the memory cell array 20 of the semiconductor device 10 shown in FIG. 1. The conductive plate 110 may perform a function of the common source line CSL shown in FIG. 3. The conductive plate 110 may support the cell array structure CAS. As used herein, "conductive plate" may also be referred to as the "plate CSL", and the "conductive plate" may mean the same as the "plate CSL".

The cell array structure CAS may include a plurality of memory cell blocks BLK. In example embodiments, the conductive plate 110 may provide a path via which a common source voltage is transferred to the cell array structure CAS.

The peripheral circuit structure PCS (see FIG. 2) may be arranged under the cell array structure CAS shown in FIG. 6. The peripheral circuit structure PCS may include the peripheral circuit 30 described with reference to FIG. 1. The cell array structure CAS may be arranged to be stacked on or otherwise overlap the peripheral circuit structure PCS in the vertical direction (Z direction) with the conductive plate 110 therebetween.

The cell array structure CAS may include the plurality of gate lines 130 sequentially stacked in the vertical direction (Z direction) on the conductive plate 110. Areas of the plurality of gate lines 130 in an X-Y plane may gradually decrease as a distance from the conductive plate 110 increases.

The plurality of gate lines 130 may be divided into the plurality of memory cell blocks BLK by a plurality of word line cut regions WLC extending lengthwise in a first horizontal direction (X direction). The plurality of gate lines 130 included in each of the plurality of memory cell blocks BLK may constitute the gate stack GS. Each of the plurality of memory cell blocks BLK may include a memory stack MST including one gate stack GS. In each of the plurality of memory stacks MST, the plurality of gate lines 130 may constitute the ground select line GSL, the plurality of word lines WL, and the string select line SSL, which are shown in FIG. 3.

Figure 7A:
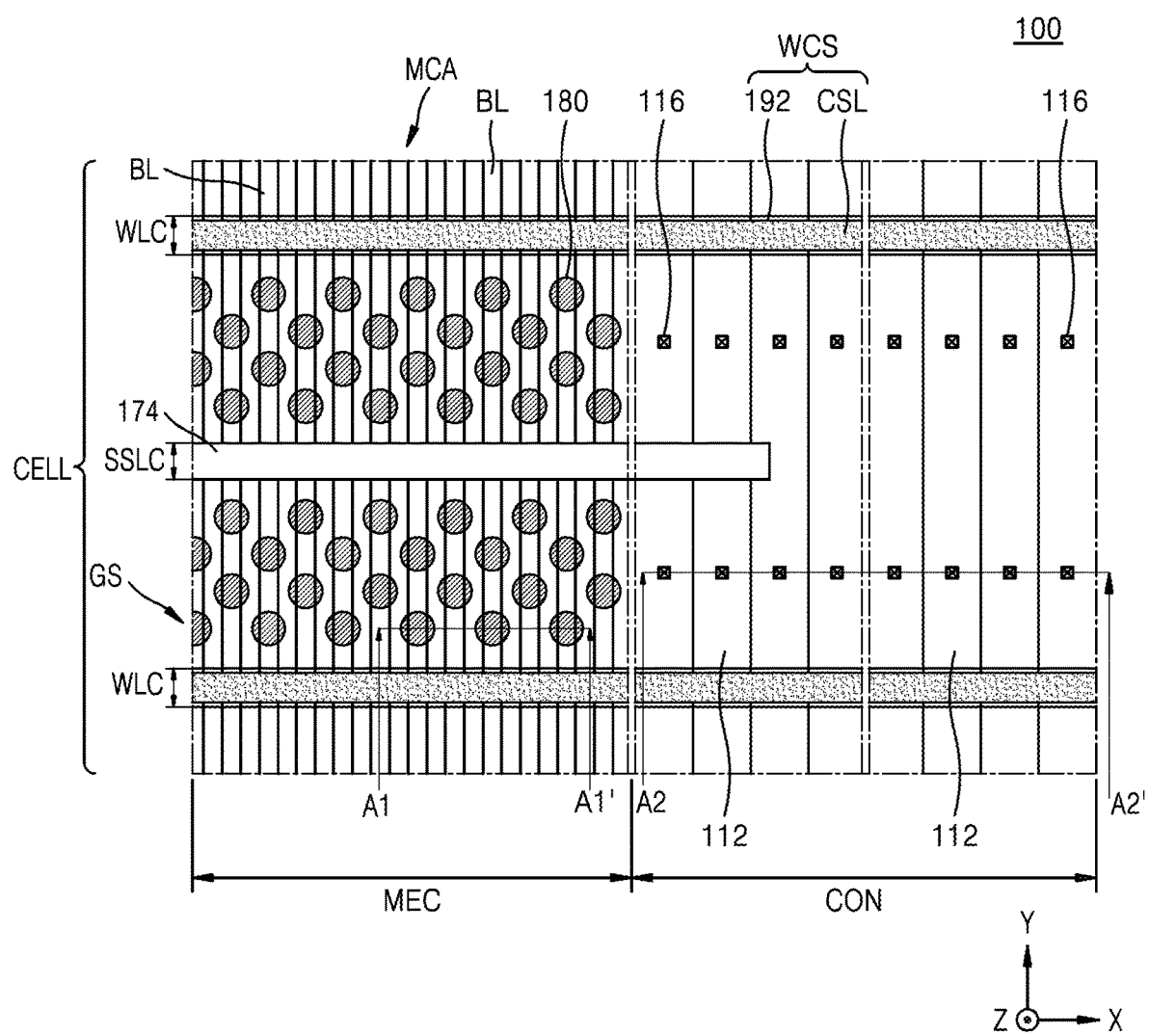
FIG. 7A is a plan view illustrating components of a cell area of a semiconductor device, according to embodiments of the inventive concept.
Figure 7B:
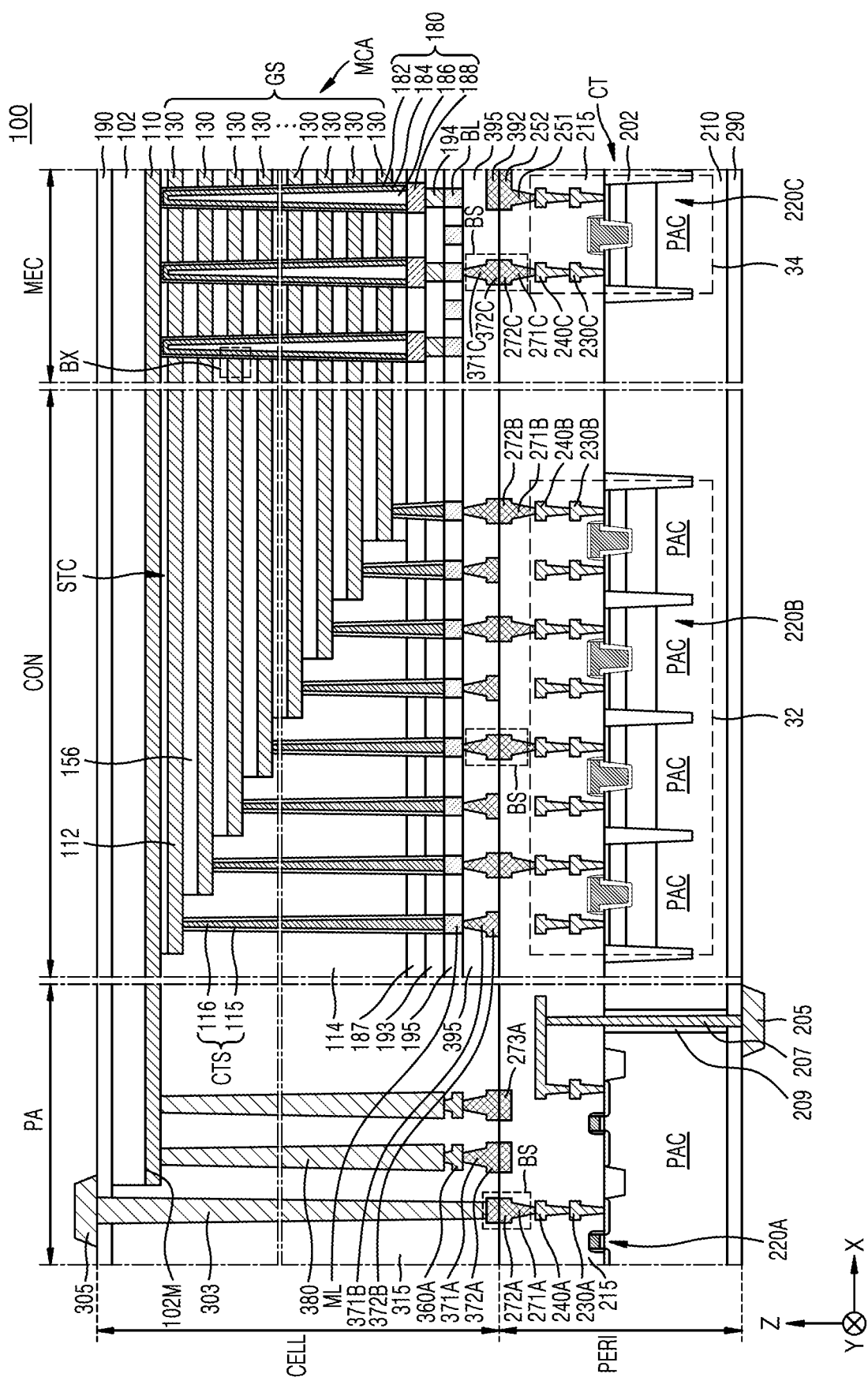
FIG. 7B illustrates cross-sectional views of respective portions of a cell area and a peripheral circuit area of the semiconductor device shown in FIG. 7A.

FIG. 7A is a plan view illustrating components of the cell area CELL of the semiconductor device 100, according to embodiments of the inventive concept. FIG. 7B illustrates cross-sectional views of respective portions of the cell area CELL and the peripheral circuit area PERI of the semiconductor device 100. FIG. 7C is a cross-sectional view illustrating some components of the peripheral circuit area PERI.

Referring to FIGS. 7A to 7C, the semiconductor device 100 may include the cell area CELL and the peripheral circuit area PERI. Each of the cell area CELL and the peripheral circuit area PERI may include a pad bonding area PA. The cell area CELL may further include a memory cell area MEC and a connection area CON. In FIG. 7B, a configuration of the memory cell area MEC of the cell area CELL may correspond to a configuration of a cross-section taken along a line A1-A1' of FIG. 7A. In FIG. 7B, a configuration of the connection area CON of the cell area CELL may correspond to a configuration of a cross-section taken along a line A2-A2' of FIG. 7A.

In example embodiments, the semiconductor device 100 may have a chip-to-chip (C2C) structure. The C2C structure may be a structure obtained by fabricating an upper chip including the cell area CELL on a first wafer, followed by fabricating a lower chip including the peripheral circuit area PERI on a second wafer that is different from the first wafer, and then connecting the upper chip to the lower chip by a bonding method. For example, the bonding method may refer to a method of electrically connecting at least one first bonding metal pad, which is formed in an uppermost metal layer of the upper chip including the cell area CELL, to at least one second bonding metal pad, which is formed in an uppermost metal layer of the lower chip including the peripheral circuit area PERI. In example embodiments, when the first and second bonding metal pads include copper (Cu), the bonding method may be a Cu—Cu bonding method. In other example embodiments, each of the first and second bonding metal pads may include aluminum (Al) or tungsten (W).

The peripheral circuit area PERI may include a peripheral circuit substrate 210, an interlayer dielectric 215, a plurality of transistors 220A, 220B, and 220C formed on the peripheral circuit substrate 210, a plurality of first metal layers 230A, 230B, and 230C respectively connected to the plurality of transistors 220A, 220B, and 220C, and a plurality of second metal layers 240A, 240B, and 240C respectively formed on the plurality of first metal layers 230A, 230B, and 230C. The peripheral circuit substrate 210 may be a continuous substrate (e.g., a single wafer or monolithic substrate with continuity of crystalline structure) that includes the transistors 220A, 220B, and 220C in respective regions or areas thereof. In example embodiments, the plurality of first metal layers 230A, 230B, and 230C may include tungsten and the plurality of second metal layers 240A, 240B, and 240C may include copper, but the inventive concept is not limited thereto.

In other example embodiments, at least one metal layer may be further formed on the plurality of second metal layers 240A, 240B, and 240C. The at least one metal layer formed on the plurality of second metal layers 240A, 240B, and 240C may include aluminum.

The interlayer dielectric 215 may cover the plurality of transistors 220A, 220B, and 220C, the plurality of first metal layers 230A, 230B, and 230C, and the plurality of second metal layers 240A, 240B, and 240C. As used herein, an element or region that is "covering" or "surrounding" or "filling" another element or region may completely or partially cover or surround or fill the other element or region. The interlayer dielectric 215 may include a silicon oxide film, a silicon nitride film, or a combination thereof.

A plurality of first bonding metal pads 371A and 372A may be arranged in the pad bonding area PA of the cell area CELL, and a plurality of second bonding metal pads 271A, 272A, and 273A may be arranged in the pad bonding area PA of the peripheral circuit area PERI. The plurality of first bonding metal pads 371A and 372A may be bonded to and thus electrically connected to the plurality of second bonding metal pads 271A, 272A, and 273A. The plurality of first bonding metal pads 371A and 372A and the plurality of second bonding metal pads 271A, 272A, and 273A may constitute a bonding structure BS.

A plurality of first bonding metal pads 371B and 372B may be arranged in the connection area CON of the cell area CELL, and a plurality of second bonding metal pads 271B and 272B may be arranged in a region of the peripheral circuit area PERI, which overlaps the connection area CON of the cell area CELL in the vertical direction (Z direction). In the peripheral circuit area PERI, the plurality of second bonding metal pads 271B and 272B may be arranged on the plurality of second metal layers 240B. The plurality of first bonding metal pads 371B and 372B may be bonded to and thus electrically connected to the plurality of second bonding metal pads 271B and 272B. The plurality of first bonding metal pads 371B and 372B and the plurality of second bonding metal pads 271B and 272B may constitute the bonding structure BS.

A plurality of first bonding metal pads 371C, 372C, and 392 may be arranged in the memory cell area MEC of the cell area CELL, and a plurality of second bonding metal pads 251, 252, 271C, and 272C may be arranged in a region of the peripheral circuit area PERI, which overlaps the memory cell area MEC of the cell area CELL in the vertical direction (Z direction). In the peripheral circuit area PERI, the plurality of second bonding metal pads 251, 252, 271C, and 272C may be arranged on the plurality of second metal layers 240C. The plurality of first bonding metal pads 371C, 372C, and 392 may be bonded to and thus electrically connected to the plurality of second bonding metal pads 251, 252, 271C, and 272C. The plurality of first bonding metal pads 371C, 372C, and 392 and the plurality of second bonding metal pads 251, 252, 271C, and 272C may constitute the bonding structure BS.

The plurality of first bonding metal pads 371A, 372A, 371B, 372B, 371C, 372C, and 392 and the plurality of second bonding metal pads 271A, 272A, 271B, 272B, 271C, 272C, 252, and 273A, which constitute the bonding structure BS, may each include aluminum, copper, or tungsten.

In the memory cell area MEC and the connection area CON, the plurality of first bonding metal pads 371B, 372B, 371C, 372C, and 392 may each be insulated by an interlayer dielectric 395. The interlayer dielectric 395 may include a silicon oxide film, a silicon nitride film, or a combination thereof.

As shown in FIGS. 7A and 7B, the cell area CELL of the semiconductor device 100 includes a cell substrate 102. The cell substrate 102 may have a main surface 102M extending in horizontal directions along the X-Y plane, in the memory cell area MEC, the connection area CON, and the pad bonding area PA. The cell substrate 102 may include a semiconductor substrate. For example, the cell substrate 102 may include Si, Ge, or SiGe.

The conductive plate 110 may be formed on the cell substrate 102. The conductive plate 110 may include a metal layer, a semiconductor layer, or a combination thereof. The memory cell array MCA may be formed on the conductive plate 110 in the memory cell area MEC. The connection area CON may be arranged adjacent to an edge of the memory cell area MEC. The memory cell area MEC may be apart from the pad bonding area PA in a lateral or horizontal direction with the connection area CON therebetween. Although only the connection area CON arranged on one side of the memory cell area MEC is illustrated in FIGS. 7A and 7B, the connection area CON may be arranged on opposing sides of the memory cell area MEC in the first horizontal direction (X direction).

The gate stack GS is arranged on the memory cell area MEC and the connection area CON of the cell substrate 102. The gate stack GS may include the plurality of gate lines 130 and a plurality of conductive pad regions 112 integrally connected to the plurality of gate lines 130. A portion of the gate stack GS, which is arranged on the memory cell area MEC, may constitute a memory cell array MCA. The memory cell array MCA may include for example, but is not limited to, 48, 64, 96, or 128 gate lines 130 stacked in the vertical direction (Z direction). The plurality of gate lines 130 included in the gate stack GS may be arranged in the memory cell area MEC, may extend in a horizontal direction parallel to the main surface 102M of the cell substrate 102, and may overlap each other in the vertical direction (Z direction). The plurality of gate lines 130 may include the plurality of word lines WL, the ground select line GSL, and the string select line SSL, which are shown in FIG. 3.

In the cell area CELL, the plurality of conductive pad regions 112 included in the gate stack GS may be arranged in the connection area CON and may constitute a step-like connection unit STC. Each of the plurality of conductive pad regions 112 may be integrally connected to (i.e., integral to or defined in a same process as) a respective gate line 130 among the plurality of gate lines 130.

As shown in FIG. 7A, the plurality of word line cut regions WLC may extend in the first horizontal direction (X direction) on the cell substrate 102. The plurality of word line cut regions WLC may define a width of the gate stack GS in a second horizontal direction (Y direction) that is perpendicular to the first horizontal direction (X direction). A plurality of common source lines CSL may extend lengthwise in the first horizontal direction (X direction) in the plurality of word line cut regions WLC on the cell substrate 102. The plurality of common source lines CSL may be formed to partially fill a word line cut region WLC on one side of each gate stack GS. In the word line cut region WLC, the common source line CSL may be surrounded by an insulating spacer 192. The common source line CSL and the insulating spacer 192 may constitute a word line cut structure WCS that penetrates the memory cell array MCA. The insulating spacer 192 may include silicon oxide, silicon nitride, SiON, SiOCN, SiCN, or a combination thereof. The common source line CSL may include a metal such as tungsten, copper, or aluminum, a conductive metal nitride such as titanium nitride or tantalum nitride, a transition metal such as titanium or tantalum, or a combination thereof. In other example embodiments, the plurality of word line cut regions WLC may be filled with only an insulating material.

Two string select lines SSL adjacent to each other in the second horizontal direction (Y direction) may be spaced apart from each other with a string select line cut region SSLC therebetween. The string select line cut region SSLC may be filled with an insulating film 174. The insulating film 174 may include an oxide film, a nitride film, or a combination thereof. In example embodiments, at least a portion of the string select line cut region SSLC may be filled with an air gap.

The plurality of gate lines 130 and the plurality of conductive pad regions 112 may each include a metal, a conductive metal nitride, or a combination thereof. For example, the plurality of gate lines 130 and the plurality of conductive pad regions 112 may each include, but are not limited to, tungsten, nickel, cobalt, tantalum, tungsten nitride, titanium nitride, tantalum nitride, or a combination thereof.

As shown in FIG. 7B, the cell area CELL may include a plurality of insulating films 156 respectively covering top surfaces and bottom surfaces of the plurality of gate lines 130. An insulating film 156 closest to the cell substrate 102 from among the plurality of insulating films 156 may have, but is not limited to, a thickness less than the other insulating films 156. The plurality of insulating films 156 may include silicon oxide, silicon nitride, or SiON.

In the memory cell area MEC, a plurality of channel structures 180 may extend lengthwise in the vertical direction (Z direction) on the conductive plate 110 through the plurality of gate lines 130 and the plurality of insulating films 156. The plurality of channel structures 180 may be arranged apart from each other with a certain distance therebetween in the first horizontal direction (X direction) and the second horizontal direction (Y direction).

Each of the plurality of channel structures 180 may include a gate dielectric film 182, a channel region 184, a filling insulating film 186, and a drain region 188. The channel region 184 may include doped polysilicon and/or undoped polysilicon. The channel region 184 may have a cylindrical shape. An internal space of the channel region 184 may be filled with the filling insulating film 186. The filling insulating film 186 may include an insulating material. For example, the filling insulating film 186 may include silicon oxide, silicon nitride, SiON, or a combination thereof. In example embodiments, the filling insulating film 186 may be omitted, and in this case, the channel region 184 may have a pillar structure without an internal space. The drain region 188 may include impurity-doped polysilicon, a metal, a conductive metal nitride, or a combination thereof. Examples of the metal constituting the drain region 188 may include tungsten, nickel, cobalt, tantalum, and the like.

A plurality of drain regions 188 may be insulated from each other by an intermediate insulating film 187. The intermediate insulating film 187 may include an oxide film, a nitride film, or a combination thereof.

Although FIG. 7B illustrates an example, in which the channel structure 180 includes the gate dielectric film 182, and in which the gate dielectric film 182 has a shape extending lengthwise in the vertical direction (Z direction) along the channel region 184, the inventive concept is not limited thereto, and various modifications and changes may be made thereto.

Figure 8A:
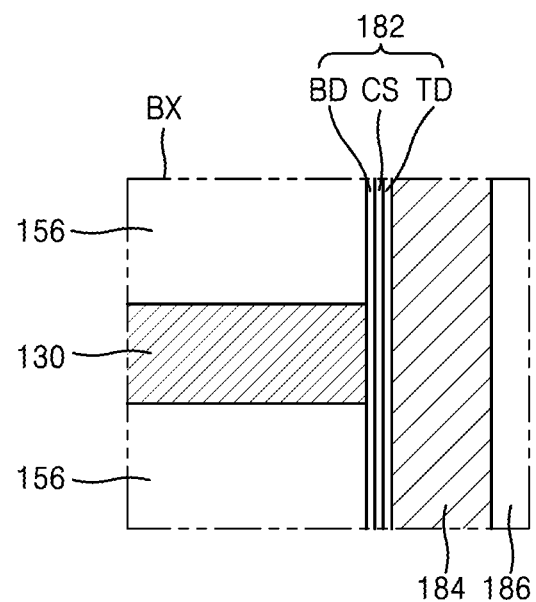
FIG. 8A is an enlarged cross-sectional view illustrating some regions of FIG. 7B.

FIG. 8A is an enlarged cross-sectional view of a region "BX" in FIG. 7B, which illustrates the gate dielectric film 182 shown in FIG. 7B, in more detail.

Referring to FIG. 8A, the gate dielectric film 182 may have a structure including a tunneling dielectric film TD, a charge storage film CS, and a blocking dielectric film BD, which are sequentially formed or otherwise provided on the channel region 184 in the stated order. Relative thicknesses of the tunneling dielectric film TD, the charge storage film CS, and the blocking dielectric film BD are not limited to those shown in FIG. 8A and may be variously modified.

The tunneling dielectric film TD may include silicon oxide, hafnium oxide, aluminum oxide, zirconium oxide, tantalum oxide, or the like. The charge storage film CS is a region, in which electrons passing through the tunneling dielectric film TD from the channel region 184 may be stored, and may include silicon nitride, boron nitride, silicon boron nitride, or impurity-doped polysilicon. The blocking dielectric film BD may include silicon oxide, silicon nitride, or a metal oxide having a dielectric constant greater than silicon oxide. The metal oxide may include hafnium oxide, aluminum oxide, zirconium oxide, tantalum oxide, or a combination thereof.

Figure 8B:
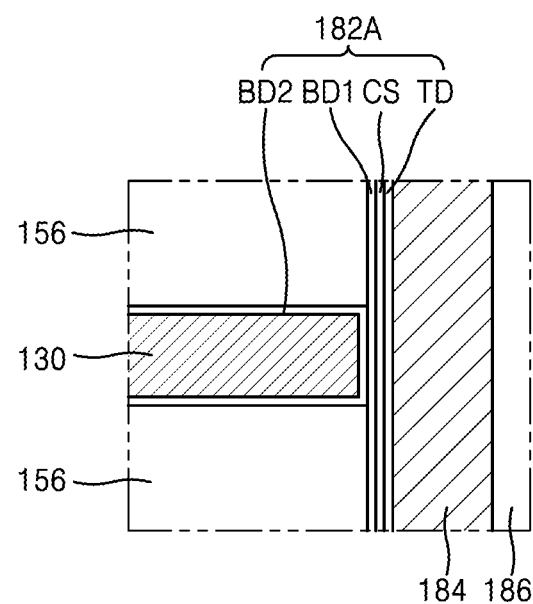
FIGS. 8B, 8C, and 8D are cross-sectional views each illustrating an example structure of a gate dielectric film that may be used in a semiconductor device, according to embodiments of the inventive concept.
Figure 8C:
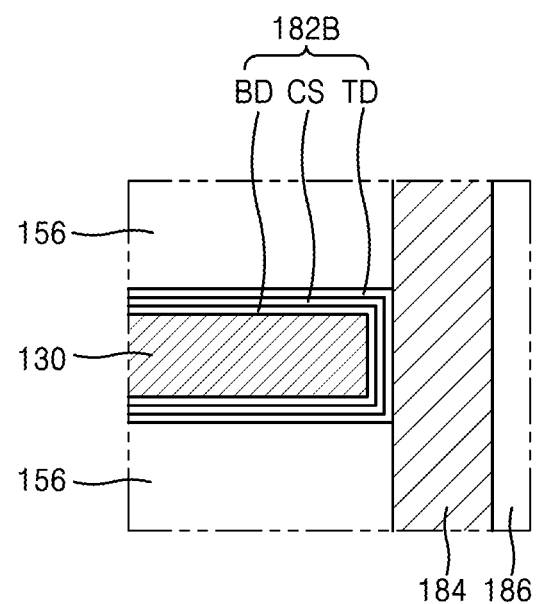
Figure 8D:
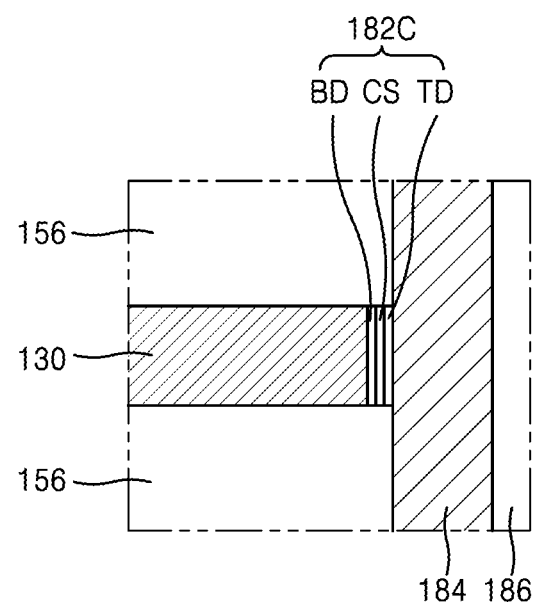

FIGS. 8B to 8D are cross-sectional views respectively illustrating example structures of gate dielectric films 182A, 182B, and 182C that may be used instead of the gate dielectric film 182 shown in FIG. 8A. A cross-sectional configuration corresponding to a region marked by "BX" in FIG. 7B is illustrated in each of FIGS. 8B to 8D.

In example embodiments, the semiconductor device 100 shown in FIGS. 7A to 7C may include the gate dielectric film 182A shown in FIG. 8B instead of the gate dielectric film 182. The gate dielectric film 182A has substantially the same configuration as the gate dielectric film 182 shown in FIG. 8A. However, the gate dielectric film 182A includes a first blocking dielectric film BD1 and a second blocking dielectric film BD2 instead of the blocking dielectric film BD. The first blocking dielectric film BD1 may extend parallel to the channel region 184, and the second blocking dielectric film BD2 may be arranged to surround the gate line 130. Each of the first blocking dielectric film BD1 and the second blocking dielectric film BD2 may include silicon oxide, silicon nitride, or a metal oxide. For example, the first blocking dielectric film BD1 may include a silicon oxide film, and the second blocking dielectric film BD2 may include a metal oxide film having a dielectric constant greater than the silicon oxide film.

In other example embodiments, the semiconductor device 100 shown in FIGS. 7A to 7C may include the gate dielectric film 182B shown in FIG. 8C instead of the gate dielectric film 182. The gate dielectric film 182B may be formed to cover a surface of the gate line 130, which faces the channel region 184, and surfaces of the gate line 130, which face the insulating film 156. The gate dielectric film 182B may include the tunneling dielectric film TD, the charge storage film CS, and the blocking dielectric film BD, which are sequentially formed or otherwise provided on the channel region 184 in the stated order, or on the gate line 130 in the opposite order.

In yet other example embodiments, the semiconductor device 100 shown in FIGS. 7A to 7C may include the gate dielectric film 182C shown in FIG. 8D instead of the gate dielectric film 182. The gate dielectric film 182C may be arranged between the gate line 130 and the channel region 184 to cover a sidewall of the gate line 130 and may not cover a bottom surface and a top surface of the gate line 130. The gate dielectric film 182C may include the tunneling dielectric film TD, the charge storage film CS, and the blocking dielectric film BD, which are sequentially formed or otherwise provided on the channel region 184 in the stated order.

The configuration and shape of the gate dielectric film, which may be included in the semiconductor device according to embodiments of the inventive concept, are not limited to the gate dielectric films 182, 182A, 182B, and 182C shown in FIGS. 8A to 8D, and various modifications and changes may be made thereto without departing from the spirit and scope of the inventive concept.

Referring again to FIGS. 7A and 7B, the plurality of conductive pad regions 112 constituting the step-like connection unit STC in the connection area CON may respectively have horizontal widths (e.g., lengths along the X direction) gradually decreasing away from the cell substrate 102 (e.g., in the Z direction). In example embodiments, a plurality of dummy channel structures (not shown) may be arranged through the step-like connection unit STC in the connection area CON. The dummy channel structures may be non-functional with respect to electrical operation of the device. The plurality of dummy channel structures may support edge portions of each gate stack GS and the plurality of conductive pad regions 112, thereby functioning to prevent the occurrence of unintended structural deformation such as bending or breaking of the aforementioned portions and regions.

In the memory cell area MEC, the plurality of bit lines BL may be arranged on the plurality of channel structures 180. A plurality of bit line contact pads 194 may be arranged between the plurality of channel structures 180 and the plurality of bit lines BL. A drain region 188 of each of the plurality of channel structures 180 may be connected to a corresponding one bit line BL from among the plurality of bit lines BL via a bit line contact pad 194. The plurality of bit line contact pads 194 may be insulated from each other by an upper insulating film 193. The plurality of bit lines BL may be insulated from each other by an interlayer dielectric 195. The plurality of bit line contact pads 194 and the plurality of bit lines BL may each include a metal, a metal nitride, or a combination thereof. For example, the plurality of bit line contact pads 194 and the plurality of bit lines BL may each include tungsten, titanium, tantalum, copper, aluminum, titanium nitride, tantalum nitride, tungsten nitride, or a combination thereof. Each of the upper insulating film 193 and the interlayer dielectric 195 may include a silicon oxide film, a silicon nitride film, or a combination thereof.

In the connection area CON of the cell area CELL, an insulating film 114 is arranged between the cell substrate 102 and the intermediate insulating film 187 to cover the step-like connection unit STC. The insulating film 114 may cover the plurality of conductive pad regions 112.

A plurality of contact structures CTS, which extend lengthwise in the vertical direction (Z direction), may be arranged on the plurality of conductive pad regions 112 of the step-like connection unit STC in the connection area CON. Each of the plurality of contact structures CTS may include a contact plug 116 extending lengthwise in the vertical direction (Z direction) and an insulating plug 115 surrounding the contact plug 116. The contact plug 116 of each of the plurality of contact structures CTS may be arranged to be electrically connected to a conductive pad region 112 of the step-like connection unit STC.

Each of the plurality of contact structures CTS may extend from the conductive pad region 112 in the vertical direction (Z direction) away from the cell substrate 102 through the insulating film 114, the intermediate insulating film 187, and the upper insulating film 193.

In the connection area CON of the cell area CELL, a plurality of wiring layers ML may be respectively arranged on the plurality of contact structures CTS. The plurality of wiring layers ML may be formed at the same height or level (relative to the substrates 102, 210) as the plurality of bit lines BL arranged in the memory cell area MEC. Each of the plurality of wiring layers ML may be connected to a respective contact plug 116. Each of the plurality of wiring layers ML may be electrically connected to one conductive pad region 112 among the plurality of conductive pad regions 112, via one contact plug 116 among a plurality of contact plugs 116. The plurality of wiring layers ML may not include portions vertically overlapping the memory cell array MCA. In the connection area CON, the plurality of wiring layers ML may be insulated from each other by the interlayer dielectric 195.

The plurality of contact plugs 116 and the plurality of wiring layers ML may each include tungsten, titanium, tantalum, copper, aluminum, titanium nitride, tantalum nitride, tungsten nitride, or a combination thereof. A plurality of insulating plugs 115 may each include a silicon nitride film, a silicon oxide film, or a combination thereof.

The peripheral circuit area PERI may include a plurality of circuits CT. The plurality of circuits CT may include the circuits included in the peripheral circuit 30 described with reference to FIG. 1, for example, the row decoder 32, the page buffer 34, the data input/output circuit 36, the control logic 38, and the common source line driver 39. In example embodiments, unit elements such as resistors or capacitors may be further arranged in the peripheral circuit area PERI.

In the memory cell area MEC of the cell area CELL, the channel structure 180 may be connected to the first bonding metal pads 371C and 372C via the bit line contact pad 194 and the bit line BL. The bit line BL may be electrically connected to the plurality of circuits CT included in the peripheral circuit area PERI, for example, to the page buffer 34, via the first bonding metal pads 371C and 372C.

The transistor 220C constituting the page buffer 34 may be connected to the second bonding metal pads 271C and 272C via the first metal layer 230C and the second metal layer 240C, and the second bonding metal pads 271C and 272C may be connected to the first bonding metal pads 371C and 372C.

In the connection area CON of the cell area CELL, one end of each of the plurality of contact structures CTS may be connected to the conductive pad region 112, and the other end of each of the plurality of contact structures CTS may be connected to the first bonding metal pads 371B and 372B via a wiring layer ML. The plurality of contact structures CTS may be connected to the plurality of circuits CT in the peripheral circuit area PERI via the first bonding metal pads 371B and 372B of the cell area CELL and the second bonding metal pads 271B and 272B of the peripheral circuit area PERI. For example, each of the plurality of contact structures CTS may be electrically connected to the row decoder 32 of the peripheral circuit area PERI. In example embodiments, an operation voltage of the transistor 220B included in the row decoder 32 may be different from an operation voltage of the transistor 220C included in the page buffer 34. For example, the operation voltage of the transistor 220C included in the page buffer 34 may be greater than the operation voltage of the transistor 220B included in the row decoder 32, but is not limited thereto.

In the pad bonding area PA, a plurality of common source line contact plugs 380 may be arranged. The plurality of common source line contact plugs 380 may each include a metal, a metal compound, polysilicon, or a combination thereof.

One end of each of the plurality of common source line contact plugs 380 may be connected to the conductive plate 110. The other end of each of the plurality of common source line contact plugs 380 may be connected to a metal layer 360A. The metal layer 360A may be connected to the first bonding metal pads 371A and 372A. Each of the first bonding metal pads 371A and 372A may be connected to a corresponding one from among the second bonding metal pads 271A, 272A, and 273A of the peripheral circuit area PERI. The plurality of common source line contact plugs 380 may be connected to the plurality of circuits CT in the peripheral circuit area PERI via the metal layer 360A, the first bonding metal pads 371A and 372A, and the second bonding metal pads 271A and 272A. In example embodiments, the plurality of common source line contact plugs 380 may be connected to the common source line driver 39 (see FIG. 1) in the peripheral circuit area PERI via the metal layer 360A, the first bonding metal pads 371A and 372A, and the second bonding metal pads 271A and 272A.

In the pad bonding area PA, a plurality of input/output pads 205 and 305 may be arranged. A peripheral circuit insulating film 290 may be formed under the peripheral circuit substrate 210 to cover a bottom surface of the peripheral circuit substrate 210, and the input/output pad 205 may be formed on the peripheral circuit insulating film 290. The input/output pad 205 may be connected to at least one of the plurality of transistors 220A, 220B, and 220C, which are arranged in the peripheral circuit area PERI, via an input/output contact plug 207, which penetrates the peripheral circuit insulating film 290 and the peripheral circuit substrate 210. An insulating spacer 209 may be arranged between the peripheral circuit substrate 210 and the input/output contact plug 207. Each of the input/output pad 205 and the input/output contact plug 207 may include a metal, for example, aluminum or tungsten. Each of the insulating spacer 209 and the peripheral circuit insulating film 290 may include an oxide film, a nitride film, or a combination thereof.

A cell insulating film 190 may be formed on the cell substrate 102 to cover a top surface of the cell substrate 102. The input/output pad 305 may be arranged on the cell insulating film 190. The input/output pad 305 may be connected to at least one of the plurality of transistors 220A, 220B, and 220C, which are arranged in the peripheral circuit area PERI, via an input/output contact plug 303 and the bonding structure BS.

The input/output contact plug 303 may be arranged horizontally apart from the cell substrate 102 and the conductive plate 110. The input/output pad 305 may not overlap the plurality of conductive pad regions 112 in the vertical direction (Z direction). The input/output contact plug 303 may be connected to the input/output pad 305 through the cell insulating film 190 and the interlayer dielectric 315. Each of the input/output pad 305 and the input/output contact plug 303 may include a metal, for example, aluminum or tungsten. In example embodiments, one of the input/output pad 205 and the input/output pad 305 may be omitted.

In the pad bonding area PA, the first bonding metal pads 371A and 372A formed in an uppermost metal layer of the cell area CELL may be connected to corresponding ones from among the second bonding metal pads 271A, 272A, and 273A formed in an uppermost metal layer of the peripheral circuit area PERI. The second bonding metal pad 273A of the peripheral circuit area PERI may not be connected to a separate contact in the peripheral circuit area PERI. Similarly, in the pad bonding area PA, a first bonding metal pad, which has the same shape as the second bonding metal pad 273A of the peripheral circuit area PERI, may be formed in the uppermost metal layer of the cell area CELL.

In the memory cell area MEC, the first bonding metal pad 392 may be arranged in the uppermost metal layer of the cell area CELL in correspondence with the second bonding metal pads 251 and 252 formed in the uppermost metal layer of the peripheral circuit area PERI. The first bonding metal pad 392 and the second bonding metal pads 251 and 252 may constitute the bonding structure BS.

In the peripheral circuit area PERI, the plurality of transistors 220A, 220B, and 220C may respectively constitute the plurality of circuits CT formed in the peripheral circuit area PERI. The plurality of transistors 220A, 220B, and 220C may be electrically connected to the memory cell area MEC via the bonding structure BS between the peripheral circuit area PERI and the cell area CELL, a wiring structure arranged in each of the memory cell area MEC, the connection area CON, and the pad bonding area PA of the cell area CELL, and/or a wiring structure arranged in the peripheral circuit area PERI.

As shown in FIG. 7C, the peripheral circuit area PERI may include a plurality of transistor areas classified according to operation voltages of the plurality of transistors 220A, 220B, and 220C. In example embodiments, the plurality of transistor areas may include a first transistor area LVR, which includes transistors having relatively low operation voltages of about 0.5 V to about 1.2 V, a second transistor area MVR, which includes transistors having intermediate operation voltages of greater than about 1.2 V and less than about 10 V, and a third transistor area HVR, which includes transistors having relatively high operation voltages equal to or greater than about 10 V. An operation voltage range in each of the first transistor area LVR, the second transistor area MVR, and the third transistor area HVR is not limited to the examples set forth above, and may vary in some cases. In example embodiments, the respective operation voltage ranges of the first transistor area LVR and the second transistor area MVR may partially overlap each other. In addition, the respective operation voltage ranges of the second transistor area MVR and the third transistor area HVR may partially overlap each other. Herein, the first transistor area LVR may be referred to as the "low-voltage transistor area", the second transistor area MVR may be referred to as the "intermediate-voltage transistor area", and the third transistor area HVR may be referred to as the "high-voltage transistor area".

In the first transistor area LVR, a first transistor TR1 having a planar channel structure, in which a channel is formed along a top surface of the peripheral circuit substrate 210, may be formed. In the second transistor area MVR, a second transistor TR2 having a planar channel structure, in which a channel is formed along a surface of the peripheral circuit substrate 210, may be formed. In the third transistor area HVR, a third transistor TR3 having a recess channel structure, in which a channel is formed along a surface of a recess trench 210R formed in the peripheral circuit substrate 210, may be formed. Herein, each of the first transistor TR1 and the second transistor TR2 may also be referred to as "planar channel transistors", and the third transistor TR3 may also be referred to as "recess channel transistor". A "channel region" may refer to a region that is configured to define a conduction channel of a transistor.

The peripheral circuit substrate 210 may have a top surface facing the cell area CELL. The peripheral circuit substrate 210 may include a semiconductor material, for example, a Group IV semiconductor, a Group III-V compound semiconductor, or a Group II-VI oxide semiconductor. For example, the Group IV semiconductor may include Si, Ge, or SiGe. The peripheral circuit substrate 210 may be provided as a bulk wafer, an epitaxial layer, a silicon-on-insulator (SOI) layer, a semiconductor-on-insulator (SeOI) layer, or the like.

The peripheral circuit substrate 210 may include a plurality of peripheral active regions PAC defined by a device isolation film 202. A plurality of wells WELL1, WELL2, and WELL3 may be formed in the plurality of peripheral active regions PAC. The plurality of wells WELL1, WELL2, and WELL3 may each include an impurity region of a conductivity type (n- or p-type) that is the same as or different from a conductivity type of the peripheral circuit substrate 210. The plurality of wells WELL1, WELL2, and WELL3 may each include an impurity region doped at a dopant concentration that is different from a dopant concentration of the peripheral circuit substrate 210. A dopant in each of the plurality of wells WELL1, WELL2, and WELL3 may include N-type impurities or P-type impurities according to a channel conductivity type of each of the first to third transistors TR1, TR2, and TR3. The device isolation film 202 may include an insulating material. For example, the device isolation film 202 may include silicon oxide, silicon nitride, or a combination thereof. The device isolation film 202 may be formed by a shallow trench isolation (STI) process.

The first transistor TR1 may include a first gate dielectric film 211 and a first gate electrode 212. A top surface of the first gate electrode 212 may be covered by a first insulating capping layer 213. Sidewalls of each of the first gate dielectric film 211, the first gate electrode 212, and the first insulating capping layer 213 may be covered by a first insulating spacer 214. The first transistor TR1 may further include a pair of first source/drain regions 216 formed in the well WELL1 on opposing sides of the first gate electrode 212. The pair of first source/drain regions 216 may include impurity regions of conductivity types opposite to a conductivity type of the well WELL1. In example embodiments, the pair of first source/drain regions 216 may include a plurality of impurity regions having different dopant concentrations.

The second transistor TR2 may include a second gate dielectric film 221 and a second gate electrode 222. A top surface of the second gate electrode 222 may be covered by a second insulating capping layer 223. Sidewalls of each of the second gate dielectric film 221, the second gate electrode 222, and the second insulating capping layer 223 may be covered by a second insulating spacer 224. The second transistor TR2 may further include a pair of second source/drain regions 226 formed in the well WELL2 on opposing sides of the second gate electrode 222. The pair of second source/drain regions 226 may include impurity regions of conductivity types opposite to a conductivity type of the well WELL2. In example embodiments, the pair of second source/drain regions 226 may include a plurality of impurity regions having different dopant concentrations.

The first gate electrode 212 of the first transistor TR1 may have a first width W1 in a horizontal direction (for example, the X direction in FIG. 7C), and the second gate electrode 222 of the second transistor TR2 may have a second width W2 greater than the first width W1 in the horizontal direction (for example, the X direction in FIG. 7C).

A thickness of the first gate dielectric film 211 of the first transistor TR1 may be less than a thickness of the second gate dielectric film 221 of the second transistor TR2. In example embodiments, the first gate dielectric film 211 may have a thickness selected from a range of about 5 Å to about 30 Å and the second gate dielectric film 221 may have a thickness selected from a range of about 30 Å to about 150 Å, but the inventive concept is not limited to the examples set forth above.

In example embodiments, at least one of the pair of first source/drain regions 216 and the pair of second source/drain regions 226 may have a lightly doped drain (LDD) structure. In other example embodiments, at least one of the pair of first source/drain regions 216 and the pair of second source/drain regions 226 may have an elevated source/drain structure in which an uppermost surface thereof is higher than the top surface of the peripheral circuit substrate 210.

The first gate dielectric film 211 arranged in the first transistor area LVR may include a high-k dielectric film. The high-k dielectric film may be a dielectric film having a higher dielectric constant than a silicon oxide film. In example embodiments, the high-k dielectric film may include aluminum oxide ($Al_2O_3$), tantalum oxide ($Ta_2O_3$), titanium oxide ($TiO_2$), yttrium oxide ($Y_2O_3$), zirconium oxide ($ZrO_2$), zirconium silicon oxide (ZrSiO), hafnium oxide ($HfO_2$), hafnium silicon oxide (HfSiO), lanthanum oxide ($La_2O_3$), lanthanum aluminum oxide (LaAlO), lanthanum hafnium oxide (LaHfO), hafnium aluminum oxide (HfAlO), praseodymium oxide ($Pr_2O_3$), or a combination thereof. In example embodiments, the first gate dielectric film 211 may include a high-k dielectric film doped with an elemental semiconductor or a metal element. For example, the first gate dielectric film 211 may include a hafnium oxide film doped with silicon (Si) or lanthanum (La). In example embodiments, the first gate dielectric film 211 may further include a first low-k dielectric film. The first low-k dielectric film may be arranged between the peripheral circuit substrate 210 and the high-k dielectric film. The first low-k dielectric film may include an oxide film, a nitride film, an oxynitride film, or a combination thereof. For example, the first low-k dielectric film may include a silicon oxide film.

The second gate dielectric film 221 arranged in the second transistor area MVR may include a second low-k dielectric film. The second low-k dielectric film may include an oxide film, a nitride film, an oxynitride film, or a combination thereof. For example, the second low-k dielectric film may include a silicon oxide film.

The third transistor TR3 arranged in the third transistor area HVR has a recess channel structure. In the third transistor area HVR in which the third transistor TR3 is arranged, the recess trench 210R, which is recessed into the peripheral circuit substrate 210, may be formed in the top surface of the peripheral circuit substrate 210. The third transistor TR3 may include a third gate dielectric film 231, which covers an inner wall of the recess trench 210R, and a third gate electrode 232, which is arranged on the third gate dielectric film 231 to fill the recess trench 210R. The third gate electrode 232 may include a filling electrode portion, which is arranged on the third gate dielectric film 231 to fill the recess trench 210R, and a protruding electrode portion, which is integrally connected to the filling electrode portion and protrudes upwards from the top surface of the peripheral circuit substrate 210. A top surface of the third gate electrode 232 may be covered by a third insulating capping layer 233. Sidewalls of each of the third gate dielectric film 231, the third gate electrode 232, and the third insulating capping layer 233 may be covered by a third insulating spacer 234.

The third transistor TR3 may further include a third source/drain region 236 formed in the well WELL3 on opposing sides of the third gate electrode 232. The third source/drain region 236 may include an impurity region of a conductivity type opposite to a conductivity type of the well WELL3. The third source/drain region 236 may include a first impurity region 236A, which has a first dopant concentration, and a shallower second impurity region 236B, which has a second dopant concentration greater than the first dopant concentration and is arranged adjacent to the top surface of the peripheral circuit substrate 210. For example, when the third transistor TR3 is an NMOS transistor, each of the first impurity region 236A and the second impurity region 236B may be doped with N-type impurities, and an N-type impurity doping concentration in the second impurity region 236B may be greater than an N-type impurity doping concentration in the first impurity region 236A. When the third transistor TR3 is a PMOS transistor, each of the first impurity region 236A and the second impurity region 236B may be doped with P-type impurities, and a P-type impurity doping concentration in the second impurity region 236B may be greater than a P-type impurity doping concentration in the first impurity region 236A.

In example embodiments, a thickness of a first portion G1 of the third gate dielectric film 231, which is arranged between the third gate electrode 232 and both of the first impurity region 236A and the second impurity region 236B, may be greater than a thickness of a second portion G2 of the third gate dielectric film 231, which is adjacent to a channel region CH3 of the third transistor TR3. In example embodiments, a thickness of the third gate dielectric film 231 may gradually decrease away from the top surface of the peripheral circuit substrate 210 towards a bottom of the recess trench 210R. By such a configuration, the third transistor TR3 may have a reduction in gate induced drain leakage current and thus exhibit good operation characteristics. In addition, because the third gate dielectric film 231 has a relatively small thickness in a portion thereof adjacent to the channel region CH3 of the third transistor TR3, the third transistor TR3 may have an increased ON-current and thus have an increased operation speed. In example embodiments, although the second portion G2 of the third gate dielectric film 231 may have a thickness selected from a range of about 150 Å to about 1,000 Å, the inventive concept is not limited to the example set forth above.

A lowermost-surface vertical level LV1 of the recess trench 210R may be equal to or higher than a lowermost-surface vertical level of the device isolation film 202, relative to the top surface of the substrate 210. That is, a depth of the recess trench 210R may be less than that of the isolation film 202 relative to the top surface of the substrate 210. In the third transistor TR3, by allowing the filling electrode portion of the third gate electrode 232, which fills the recess trench 210R, to have a sufficiently great length in the vertical direction (Z direction), the third transistor TR3 may have an increased channel length and thus have a reduced OFF-current. In addition, by allowing the filling electrode portion of the third gate electrode 232, which fills the recess trench 210R, to have a sufficiently greater length in the vertical direction (Z direction), a vertical-direction (Z direction) length DH1 of the first impurity region 236A may be sufficient to allow the third transistor TR3 to provide a sufficient depletion region, thereby increasing or maximizing a pressure-resistant effect of the third transistor TR3.

The third gate dielectric film 231 may include a silicon oxide film, SiON, GeON, GeSiO, a high-k dielectric film, or a combination thereof. Examples of particular films that may be used as the high-k dielectric film are as described above regarding the high-k dielectric film that may be included in the first gate dielectric film 211.

Each of the first gate electrode 212, the second gate electrode 222, and the third gate electrode 232 may include doped polysilicon or a metal-containing film. The doped polysilicon may be doped with N-type or P-type impurities. In example embodiments, the P-type impurities may include boron (B), boron fluoride ($BF_2$), indium (In), or the like, and the N-type impurities may include phosphorus (P), arsenic (As), or the like. In example embodiments, the metal-containing film constituting the first gate electrode 212, the second gate electrode 222, and the third gate electrode 232 may include titanium (Ti), titanium nitride (TiN), tungsten (W), tungsten nitride (WN), titanium aluminum (TiAl), titanium aluminum nitride (TiAlN), tantalum (Ta), tantalum nitride (TaN), titanium carbide (TiC), tantalum carbide (TaC), tantalum carbonitride (TaCN), tantalum silicon nitride (TaSiN), cobalt (Co), ruthenium (Ru), copper (Cu), molybdenum (Mo), aluminum (Al), or a combination thereof. A vertical-direction (Z-direction) thickness of each of the first gate electrode 212, the second gate electrode 222, and the third gate electrode 232 is not limited to the example shown in FIG. 7C and may be variously selected as needed.

The first to third insulating capping layers 213, 223, and 233 and the first to third insulating spacers 214, 224, and 234 may each include an oxide film, a nitride film, an oxynitride film, or a combination thereof.

The first transistor TR1 formed in the first transistor area LVR includes the first gate dielectric film 211 and the first gate electrode 212, whereby high-speed operation characteristics and reliability thereof may be improved. Accordingly, at least some of low-voltage transistors, which may provide high-speed operation among transistors in the peripheral circuit area of the semiconductor device 100, may have the structure of the first transistor TR1. For example, at least some of transistors constituting the data input/output circuit 36 described with reference to FIG. 1 may have the structure of the first transistor TR1. At least one of circuits included in the peripheral circuit 30 described with reference to FIG. 1 may include the second transistor TR2 formed in the second transistor area MVR.

The structure of the third transistor TR3 formed in the third transistor area HVR may be applied to transistors generating or transferring high voltages. For example, at least some of transistors constituting the row decoder 32, the page buffer 34, and the common source line driver 39, which are described with reference to FIG. 1, may have the structure of the third transistor TR3. In example embodiments, at least one of the string select line driver 62, the word line driver 64, the ground select line driver 66, and the block selector 68, which constitute the row decoder 32 described with reference to FIG. 5, may include the third transistor TR3 formed in the third transistor area HVR. In other example embodiments, the row decoder 32 shown in FIGS. 1 and 5 may include a high-voltage switch receiving a high voltage, which is higher than a power supply voltage, from outside the semiconductor device 10. For example, during a program or erase operation of a memory cell included in the memory cell array 20 shown in FIG. 1, a high voltage of about 20 V or more may be used. In addition, to control such a high voltage, a high voltage may be provided to the high-voltage switch from outside the semiconductor device 10. The high-voltage switch may include the third transistor TR3 formed in the third transistor area HVR. In addition, the plurality of pass transistors TR_P included in the block selector 68 of the row decoder 32 described with reference to FIG. 5 may transfer a voltage, which is generated by a voltage generator (not shown) included in the peripheral circuit 30, to row lines of the memory cell array 20, that is, to the ground select line GSL, the string select line SSL, and the plurality of word lines WL1, WL2, . . . , WLn−1, and WLn. A word line voltage transferred by the plurality of pass transistors TR_P may be a relatively high voltage that is higher than voltages for driving general circuits. Accordingly, the plurality of pass transistors TR_P may include the third transistor TR3 formed in the third transistor area HVR.

For example, when a high-voltage transistor driven at a high voltage includes a planar channel transistor, to prevent punch-through between a source and a drain in the high-voltage transistor and improve pressure-resistant characteristics thereof, a channel length needs to be relatively large. In addition, a gate dielectric film of the high-voltage transistor needs to have a thickness that is greater than a thickness of a low-voltage transistor to withstand a high electric potential difference between a gate electrode and a source/drain region. Accordingly, when a high-voltage transistor includes a planar channel transistor, the high-voltage transistor may require a larger chip area than a low-voltage transistor.

According to the inventive concept, by applying different optimized structures to transistors according to operation voltages by considering functions of the transistors, the operation characteristics and reliability of the semiconductor device 100 may be secured. In addition, in the semiconductor device 100, even when the number of stacks of the word line WL is increased to improve the degree of integration, and thus, the number of transistors connected to memory cells is increased, the third transistor TR3 having a relatively high operation voltage and formed in the third transistor area HVR may have a recess channel structure in which a channel is formed along the surface of the recess trench 210R formed in the peripheral circuit substrate 210, thereby reducing (or preventing an increase in) the chip area due to the high-voltage transistor. Therefore, even when the number of stacks of the word line WL is increased, and thus, the number of transistors connected to the memory cells is increased, an increase in the area occupied by the peripheral circuit area PERI may be suppressed or limited, and a semiconductor device having a structure advantageous for high integration and planar size reduction may be provided.

Figure 9:
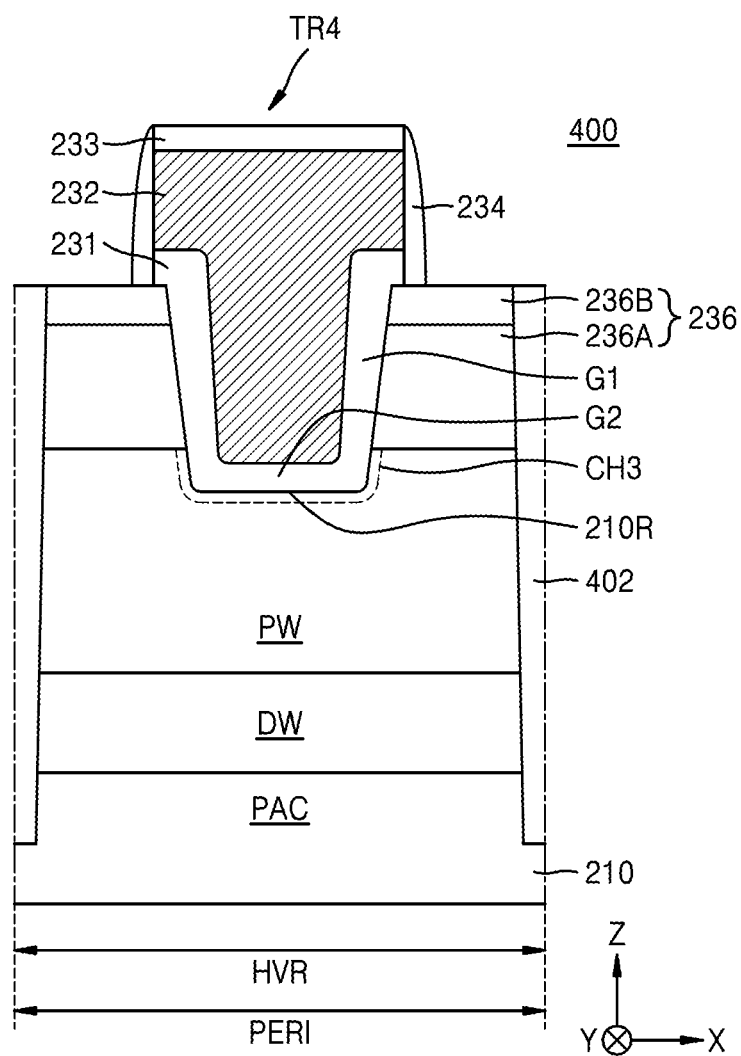
FIG. 9 is a cross-sectional view illustrating a semiconductor device, according to other embodiments of the inventive concept.

FIG. 9 is a cross-sectional view illustrating a semiconductor device 400 according to other embodiments of the inventive concept. In FIG. 9, the same reference numerals as in FIG. 7C denote the same members, and repeated descriptions thereof are omitted.

Referring to FIG. 9, the semiconductor device 400 has substantially the same configuration as the semiconductor device 100 described with reference to FIGS. 6 and 7A to 7C. However, the semiconductor device 400 may include a fourth transistor TR4, which is arranged in the plurality of peripheral active regions PAC defined by a device isolation film 402 in the third transistor area HVR of the peripheral circuit area PERI, and which has a recess channel structure having a channel formed along the surface of the recess trench 210R that is formed in the peripheral circuit substrate 210.

The fourth transistor TR4 may have substantially the same configuration as the third transistor TR3 illustrated in FIG. 7C. However, the fourth transistor TR4 may have a triple-well structure. The fourth transistor TR4 may be a transistor having a relatively high operation voltage equal to or greater than about 10 V. A pocket well PW including the recess trench 210R therein or otherwise accommodating the fourth transistor TR4, and a deep well DW including or accommodating the pocket well PW thereon may be formed at a position at which the fourth transistor TR4 is arranged in a peripheral active region PAC.

When the fourth transistor TR4 is an NMOS transistor, each of the deep well DW and the pair of third source/drain regions 236 may be an impurity region doped with N-type impurities, and the pocket well PW may be an impurity region doped with P-type impurities. When the fourth transistor TR4 is a PMOS transistor, each of the deep well DW and the pair of third source/drain regions 236 may be an impurity region doped with P-type impurities, and the pocket well PW may be an impurity region doped with N-type impurities.

The deep well DW may be formed in a portion of the peripheral active region PAC, the portion being defined by the device isolation film 402. A lowermost portion of the deep well DW may be at a higher level (relative to the substrate 210) than a lowermost portion of the device isolation film 402. A more detailed configuration of the device isolation film 402 is substantially the same as described regarding the device isolation film 202 with reference to FIGS. 7B and 7C.

The semiconductor device 400 may include a plurality of fourth transistors TR4 in the third transistor area HVR of the peripheral circuit area PERI. Because the fourth transistor TR4 has a triple-well structure, insulating properties between the fourth transistor TR4 and transistors, which are adjacent thereto and have different conductivity-type channels, may be reinforced, and other circuits around the fourth transistor TR4 may have no damage when the fourth transistor TR4 is operated at a relatively high operation voltage equal to or greater than about 10 V.

Figure 10:
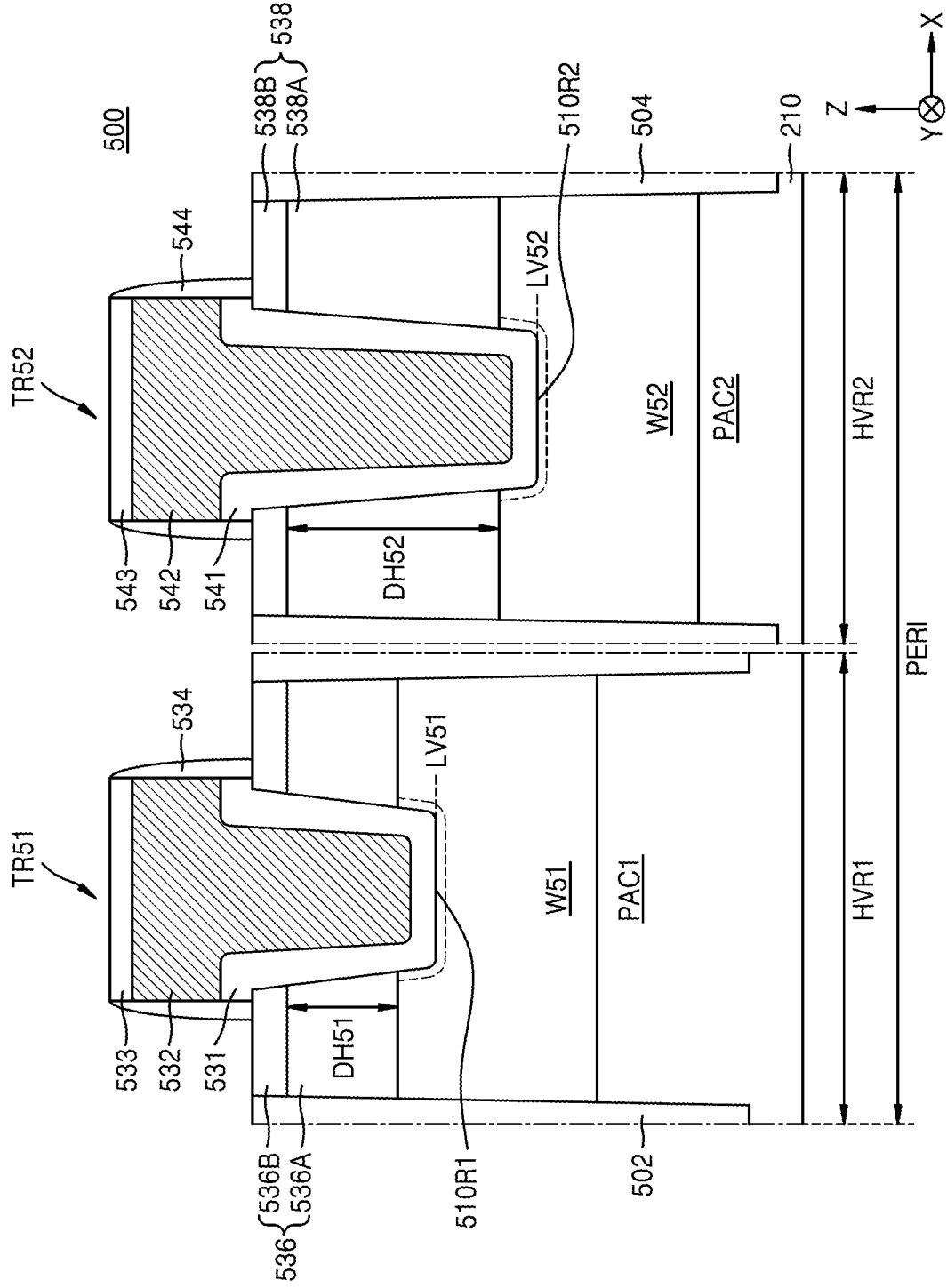
FIG. 10 is a cross-sectional view illustrating a semiconductor device, according to yet other embodiments of the inventive concept.

FIG. 10 is a cross-sectional view illustrating a semiconductor device 500 according to yet other embodiments of the inventive concept. In FIG. 10, the same reference numerals as in FIG. 7C denote the same members, and repeated descriptions thereof are omitted.

Referring to FIG. 10, the semiconductor device 500 has substantially the same configuration as the semiconductor device 100 described with reference to FIGS. 6 and 7A to 7C. However, the peripheral circuit area PERI of the semiconductor device 500 may include a plurality of high-voltage transistor areas HVR1 and HVR2, which include a plurality of transistors having relatively high operation voltages that are equal to or greater than about 10 V and different from each other.

The plurality of high-voltage transistor areas HVR1 and HVR2 may include a first high-voltage transistor area HVR1 having a first operation voltage and a second high-voltage transistor area HVR2 having a second operation voltage greater than the first operation voltage. In example embodiments, transistors having operation voltages of about 20 V or more may be formed in the first high-voltage transistor area HVR1, and transistors having operation voltages of about 30 V or more may be formed in the second high-voltage transistor area HVR2. In other example embodiments, transistors having operation voltages of about 30 V or more may be formed in the first high-voltage transistor area HVR1, and transistors having operation voltages of about 50 V or more may be formed in the second high-voltage transistor area HVR2. However, the inventive concept is not limited to the examples described above, and various modifications may be made thereto.

A device isolation film 502 defining a first peripheral active region PAC1 may be formed in the first high-voltage transistor area HVR1. A device isolation film 504 defining a second peripheral active region PAC2 may be formed in the second high-voltage transistor area HVR2. A first high-voltage transistor TR51 may be formed in the first peripheral active region PAC1 in the first high-voltage transistor area HVR1, and a second high-voltage transistor TR52 may be formed in the second peripheral active region PAC2 in the second high-voltage transistor area HVR2. Each of the first high-voltage transistor TR51 and the second high-voltage transistor TR52 may have substantially the same configuration as the third transistor TR3 described with reference to FIG. 7C. The first high-voltage transistor TR51 may have a recess channel structure in which a channel is formed along a surface of a first recess trench 510R1 formed in the peripheral circuit substrate 210, and the second high-voltage transistor TR52 may have a recess channel structure in which a channel is formed along a surface of a second recess trench 510R2 formed in the peripheral circuit substrate 210. However, a lowermost surface level LV52 of the second recess trench 510R2 may be lower than a lowermost surface level LV51 of the first recess trench 510R1 relative to the substrate 201. That is, a vertical length or depth from the top surface of the peripheral circuit substrate 210 to a lowermost surface of the second recess trench 510R2 may be greater than a vertical length or depth from the top surface of the peripheral circuit substrate 210 to a lowermost surface of the first recess trench 510R1. In the vertical direction (Z direction), a length of a gate electrode 542 of the second high-voltage transistor TR52 may be greater or may extend deeper than a length of a gate electrode 532 of the first high-voltage transistor TR51. In a horizontal direction, respective gate lengths or widths of the first high-voltage transistor TR51 and the second high-voltage transistor TR52 may be equal to or different from each other. Respective channel lengths of the first high-voltage transistor TR51 and the second high-voltage transistor TR52 may be equal to or different from each other. The depth or vertical-direction gate length, the width or horizontal-direction gate length, and the channel length of each of the first high-voltage transistor TR51 and the second high-voltage transistor TR52 may be variously selected as needed, and are not limited to the configurations shown.

The device isolation film 504 defining the second peripheral active region PAC2, in which the second high-voltage transistor TR52 is formed, may be formed deeper into the peripheral circuit substrate 210 than the device isolation film 502 defining the first peripheral active region PAC1, in which the first high-voltage transistor TR51 is formed.

The first high-voltage transistor TR51 may include a gate dielectric film 531 between an inner wall of the first recess trench 510R1 and the gate electrode 532. A top surface of the gate electrode 532 may be covered by an insulating capping layer 533. Sidewalls of each of the gate dielectric film 531, the gate electrode 532, and the insulating capping layer 533 may be covered by an insulating spacer 534. The first high-voltage transistor TR51 may include a pair of source/drain regions 536 formed in a well W51 on opposing sides of the gate electrode 532. The pair of source/drain regions 536 may include a first impurity region 536A and a shallower second impurity region 536B, each including an impurity region of a conductivity type (n- or p-type) opposite to a conductivity type of the well W51. A dopant concentration of the second impurity region 536B may be greater than a dopant concentration of the first impurity region 536A.

The second high-voltage transistor TR52 may include a gate dielectric film 541 between an inner wall of the second recess trench 510R2 and the gate electrode 542. A top surface of the gate electrode 542 may be covered by an insulating capping layer 543. Sidewalls of each of the gate dielectric film 541, the gate electrode 542, and the insulating capping layer 543 may be covered by an insulating spacer 544. The second high-voltage transistor TR52 may include source/drain regions 538 formed in a well W52 on opposing sides of the gate electrode 542. The source/drain regions 538 may include a first impurity region 538A and a shallower second impurity region 538B, each including an impurity region of a conductivity type opposite to a conductivity type of the well W52. A dopant concentration of the second impurity region 538B may be greater than a dopant concentration of the first impurity region 538A.

A thickness of the gate dielectric film 531 included in the first high-voltage transistor TR51 may be equal to or different from a thickness of the gate dielectric film 541 included in the second high-voltage transistor TR52. The thickness of each of the gate dielectric film 531 and the gate dielectric film 541 may be variously selected as needed.

A depth or vertical-direction (Z direction) length DH52 of the first impurity region 538A included in the second high-voltage transistor TR52 may be greater than a depth or vertical-direction (Z direction) length DH51 of the first impurity region 536A included in the first high-voltage transistor TR51 relative to the top surface of the substrate 210. Accordingly, a width of a depletion region in the second high-voltage transistor TR52 may be greater than a width of a depletion region in the first high-voltage transistor TR51. The second high-voltage transistor TR52 may provide a greater depletion region than the first high-voltage transistor TR51, thereby achieving an improved pressure-resistant effect.

In example embodiments, a dopant concentration of the pair of source/drain regions 536 included in the first high-voltage transistor TR51 may be different from a dopant concentration of the pair of source/drain regions 538 included in the second high-voltage transistor TR52. In one example, the dopant concentration of the source/drain regions 538 included in the second high-voltage transistor TR52 may be greater than the dopant concentration of the source/drain regions 536 included in the first high-voltage transistor TR51. In another example, the dopant concentration of the source/drain regions 538 included in the second high-voltage transistor TR52 may be equal to or similar to the dopant concentration of the source/drain regions 536 included in the first high-voltage transistor TR51.

In the semiconductor device 500 shown in FIG. 10, more detailed configurations of the device isolation films 502 and 504, the gate dielectric films 531 and 541, the gate electrodes 532 and 542, the insulating capping layers 533 and 543, and insulating spacers 534 and 544 may be substantially the same as described regarding the device isolation film 202, the third gate dielectric film 231, the third gate electrode 232, the third insulating capping layer 233, and the third insulating spacer 234, which are described with reference to FIG. 7C, respectively.

In other example embodiments, at least one of the first high-voltage transistor TR51 and the second high-voltage transistor TR52 may have a triple-well structure, similar to the fourth transistor TR4 shown in FIG. 9.

According to the semiconductor device 500 shown in FIG. 10, the semiconductor device 500 includes the plurality of high-voltage transistor areas HVR1 and HVR2, in which a plurality of transistors TR51 and TR52 having relatively high operation voltages equal to or greater than about 10 V are respectively arranged, in the peripheral circuit area PERI, and the plurality of transistors TR51 and TR52 having different operation voltages from each other are respectively formed in the plurality of high-voltage transistor areas HVR1 and HVR2. Based on the operation voltages of the plurality of transistors TR51 and TR52, the plurality of transistors TR51 and TR52 may respectively include the device isolation films 502 and 504 having different vertical lengths or depths from each other, may respectively include the gate electrodes 532 and 542 having different vertical lengths or depths from each other, and may respectively have different depletion region widths. Accordingly, for the plurality of transistors TR51 and TR52 having relatively high operation voltages equal to or greater than about 10 V, operation characteristics may be improved or optimized according to the respective operation voltages thereof.

Figure 11:
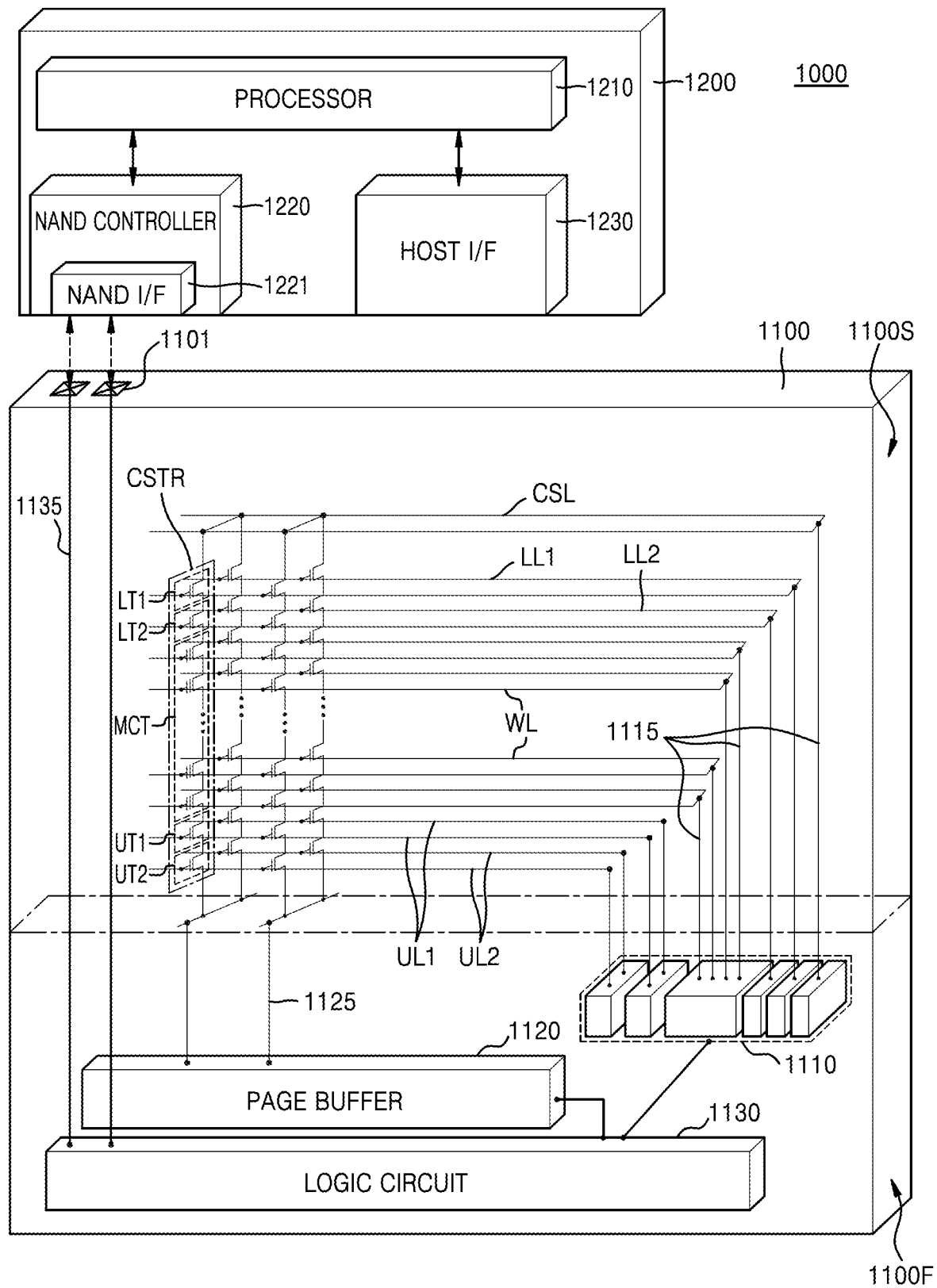
FIG. 11 is a schematic diagram illustrating an electronic system including a semiconductor device, according to an embodiment of the inventive concept.

FIG. 11 is a schematic diagram illustrating an electronic system including a semiconductor device, according to an embodiment of the inventive concept.

Referring to FIG. 11, an electronic system 1000 according to an embodiment of the inventive concept may include a semiconductor device 1100 and a controller 1200 electrically connected to the semiconductor device 1100. The electronic system 1000 may include a storage device including one semiconductor device 1100 or a plurality of semiconductor devices 1100, or an electronic device including the storage device. For example, the electronic system 1000 may include a solid state drive (SSD) device, a universal serial bus (USB) device, a computing system, a medical device, or a communication device, which includes at least one semiconductor device 1100.

The semiconductor device 1100 may include a non-volatile memory device. For example, the semiconductor device 1100 may include a NAND flash memory device including at least one of the structures described above regarding the semiconductor devices 10, 100, 400, and 500, which have been described with reference to FIGS. 1 to 10. The semiconductor device 1100 may include a first structure 1100F and a second structure 1100S on the first structure 1100F. In example embodiments, the first structure 1100F may be arranged beside the second structure 1100S. The first structure 1100F may be a peripheral circuit structure including a decoder circuit 1110, a page buffer 1120, and a logic circuit 1130. The second structure 1100S may be a memory cell structure including a bit line BL, a common source line CSL, a plurality of word lines WL, first and second upper gate lines UL1 and UL2, first and second lower gate lines LL1 and LL2, and a plurality of memory cell strings CSTR between the bit line BL and the common source line CSL.

In the second structure 1100S, each of the plurality of memory cell strings CSTR may include lower transistors LT1 and LT2 adjacent to the common source line CSL, upper transistors UT1 and UT2 adjacent to the bit line BL, and a plurality of memory cell transistors MCT between the lower transistors LT1 and LT2 and the upper transistors UT1 and UT2. The number of lower transistors LT1 and LT2 and the number of upper transistors UT1 and UT2 may be variously modified according to embodiments.

In example embodiments, the upper transistors UT1 and UT2 may each include a string select transistor, and the lower transistors LT1 and LT2 may each include a ground select transistor. A plurality of lower gate lines LL1 and LL2 may be gate electrodes of the lower transistors LT1 and LT2, respectively. A word line WL may be a gate electrode of a memory cell transistor MCT, and the upper gate lines UL1 and UL2 may be gate electrodes of the upper transistors UT1 and UT2, respectively.

The common source line CSL, the plurality of lower gate lines LL1 and LL2, the plurality of word lines WL, and the plurality of upper gate lines UL1 and UL2 may be electrically connected to the decoder circuit 1110 via a plurality of first connection wiring lines 1115, which extend from inside the first structure 1100F to the second structure 1100S. A plurality of bit lines BL may be electrically connected to the page buffer 1120 via a plurality of second connection wiring lines 1125, which extend from inside the first structure 1100F to the second structure 1100S.

In the first structure 1100F, the decoder circuit 1110 and the page buffer 1120 may perform a control operation on at least one of the plurality of memory cell transistors MCT. The decoder circuit 1110 and the page buffer 1120 may be controlled by the logic circuit 1130.

The semiconductor device 1100 may communicate with the controller 1200 via an input/output pad 1101 electrically connected to the logic circuit 1130. The input/output pad 1101 may be electrically connected to the logic circuit 1130 via an input/output connection wiring line 1135, which extends from inside the first structure 1100F to the second structure 1100S.

The controller 1200 may include a processor 1210, a NAND controller 1220, and a host interface 1230. In example embodiments, the electronic system 1000 may include a plurality of semiconductor devices 1100, and in this case, the controller 1200 may control the plurality of semiconductor devices 1100.

The processor 1210 may control overall operations of the electronic system 1000 including the controller 1200. The processor 1210 may be operated according to certain firmware and may access the semiconductor device 1100 by controlling the NAND controller 1220. The NAND controller 1220 may include a NAND interface 1221 that processes communication with the semiconductor device 1100. Via the NAND interface 1221, a control command for controlling the semiconductor device 1100, data intended to be written to the plurality of memory cell transistors MCT of the semiconductor device 1100, data intended to be read from the plurality of memory cell transistors MCT of the semiconductor device 1100, and the like may be transmitted. The host interface 1230 may provide a function of communication between the electronic system 1000 and an external host. When receiving a control command from the external host via the host interface 1230, the processor 1210 may control the semiconductor device 1100 in response to the control command.

Figure 12:
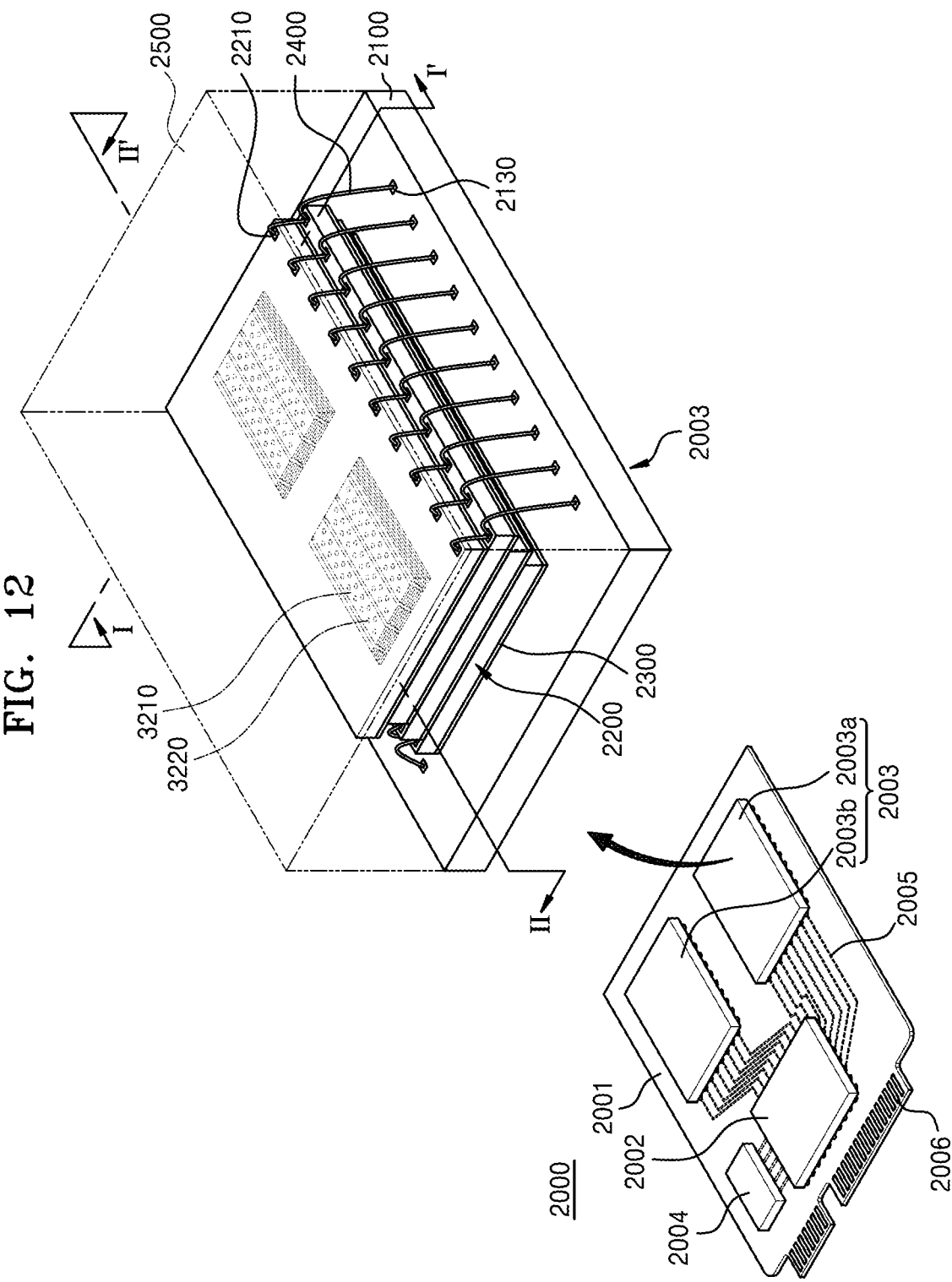
FIG. 12 is a schematic perspective view illustrating an electronic system including a semiconductor device, according to an embodiment of the inventive concept.

FIG. 12 is a schematic perspective view illustrating an electronic system including a semiconductor device, according to an embodiment of the inventive concept.

Referring to FIG. 12, an electronic system 2000 according to an example embodiment of the inventive concept may include a main substrate 2001, a controller 2002 mounted on the main substrate 2001, one or more semiconductor packages 2003, and DRAM 2004. The semiconductor packages 2003 and the DRAM 2004 may be connected to the controller 2002 by a plurality of wiring patterns 2005 formed on the main substrate 2001.

The main substrate 2001 may include a connector 2006 including a plurality of pins configured to be coupled to an external host. The number and arrangement of the plurality of pins in the connector 2006 may vary according to a communication interface between the electronic system 2000 and the external host. In example embodiments, the electronic system 2000 may communicate with the external host according to one of interfaces such as Universal Serial Bus (USB), Peripheral Component Interconnect Express (PCI-Express), Serial Advanced Technology Attachment (SATA), and M-Phy for Universal Flash Storage (UFS). In example embodiments, the electronic system 2000 may be operated by power supplied from the external host via the connector 2006. The electronic system 2000 may further include a power management integrated circuit (PMIC) distributing the power, which is supplied from the external host, to the controller 2002 and the semiconductor packages 2003.

The controller 2002 may write data to or read data from the semiconductor packages 2003 and may improve an operation speed of the electronic system 2000.

The DRAM 2004 may be a buffer memory for alleviating a speed difference between the external host and the semiconductor packages 2003, which are data storage spaces. The DRAM 2004 included in the electronic system 2000 may also operate as a kind of cache memory and may provide a space for temporarily storing data in a control operation on the semiconductor packages 2003. When the DRAM 2004 is included in the electronic system 2000, the controller 2002 may further include a DRAM controller for controlling the DRAM 2004, in addition to a NAND controller for controlling the semiconductor packages 2003.

The semiconductor packages 2003 may include first and second semiconductor packages 2003*a* and 2003*b*, which are apart or distinct from each other. Each of the first and second semiconductor packages 2003*a* and 2003*b* may be a semiconductor package including a plurality of semiconductor chips 2200. Each of the first and second semiconductor packages 2003*a* and 2003*b* may include a package substrate 2100, the plurality of semiconductor chips 2200 on the package substrate 2100, an adhesive layer 2300 on a lower surface of each of the plurality of semiconductor chips 2200, a connection structure 2400 electrically connecting the plurality of semiconductor chips 2200 to the package substrate 2100, and a molding layer 2500 arranged on the package substrate 2100 to cover the plurality of semiconductor chips 2200 and the connection structure 2400.

The package substrate 2100 may include a printed circuit board including a plurality of package upper pads 2130. Each of the plurality of semiconductor chips 2200 may include an input/output pad 2210. The input/output pad 2210 may correspond to the input/output pad 1101 of FIG. 11. Each of the plurality of semiconductor chips 2200 may include a plurality of gate stacks 3210 and a plurality of channel structures 3220. Each of the plurality of semiconductor chips 2200 may include at least one of the semiconductor devices 10, 100, 400, and 500 described with reference to FIGS. 1 to 10.

In example embodiments, the connection structure 2400 may include a bonding wire electrically connecting the input/output pad 2210 to a package upper pad 2130. Accordingly, in the first and second semiconductor packages 2003*a* and 2003*b*, the plurality of semiconductor chips 2200 may be electrically connected to each other in a bonding wire manner and may be electrically connected to the package upper pads 2130 of the package substrate 2100. In example embodiments, in the first and second semiconductor packages 2003*a* and 2003*b*, the plurality of semiconductor chips 2200 may be electrically connected to each other by a connection structure including a through-silicon via (TSV) rather than by the connection structure 2400 of the bonding wire type.

In example embodiments, the controller 2002 and the plurality of semiconductor chips 2200 may be included in one package (e.g., in 2003*a* or 2003*b*). In an example embodiment, the controller 2002 and the plurality of semiconductor chips 2200 may be mounted on a separate interposer substrate, which is different from the main substrate 2001, and may be connected to each other by wiring lines formed on the interposer substrate.

Figure 13:
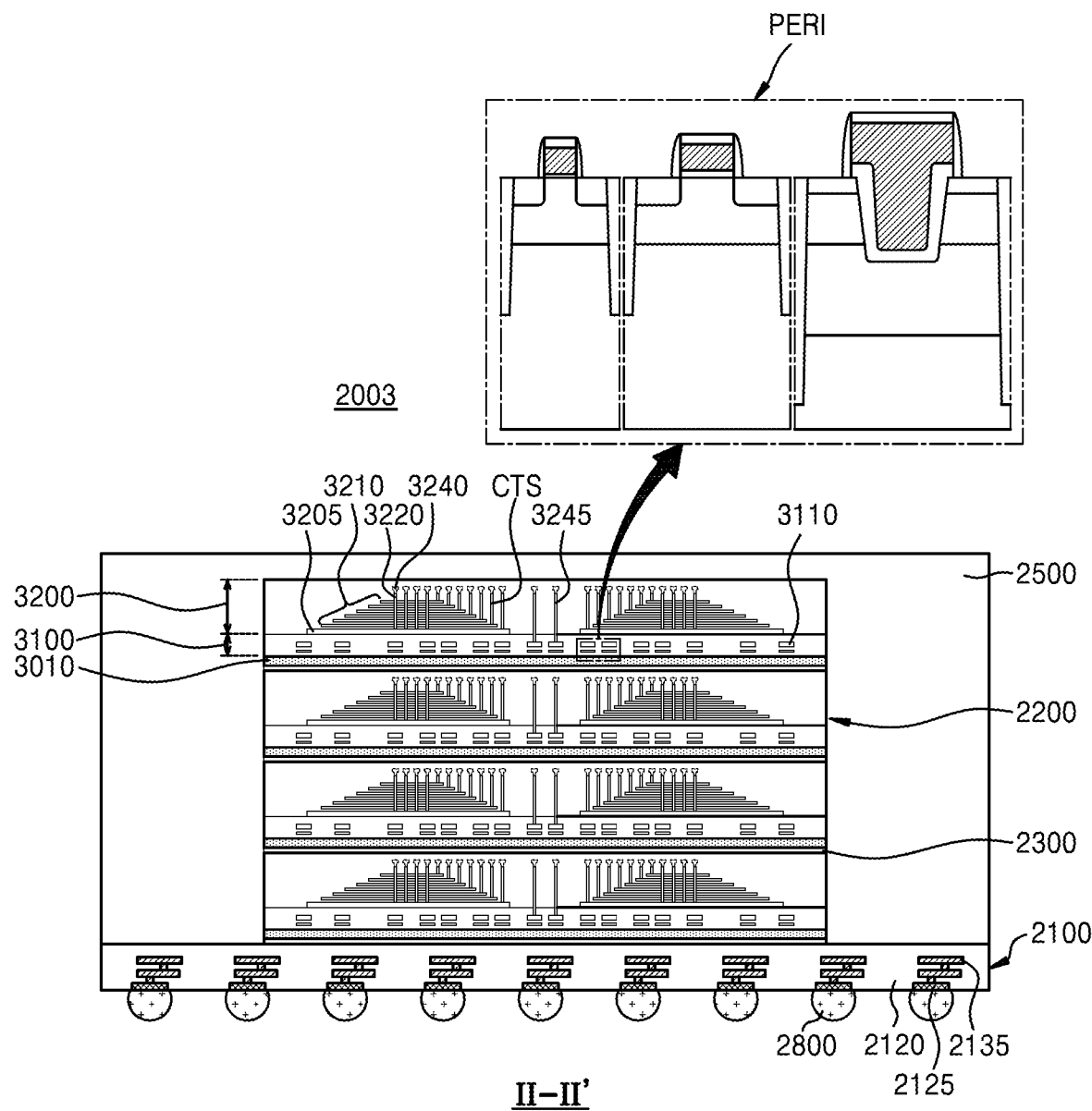
FIG. 13 is a schematic cross-sectional view illustrating semiconductor packages according to an embodiment of the inventive concept.

FIG. 13 is a schematic cross-sectional view illustrating semiconductor packages according to an embodiment of the inventive concept. FIG. 13 illustrates a configuration corresponding to a cross-section taken along a line II-II' of FIG. 12, in more detail.

Referring to FIG. 13, in the semiconductor package 2003, the package substrate 2100 may include a printed circuit board. The package substrate 2100 may include a package substrate body 2120, the plurality of package upper pads 2130 (see FIG. 12) arranged on an upper surface of the package substrate body 2120, a plurality of lower pads 2125 arranged on or exposed by a lower surface of the package substrate body 2120, and a plurality of internal wiring lines 2135 arranged inside the package substrate body 2120 to electrically connect the plurality of package upper pads 2130 to the plurality of lower pads 2125. The plurality of package upper pads 2130 may be electrically connected to a plurality of connection structures 2400. The plurality of lower pads 2125 may be connected to the plurality of wiring patterns 2005 on the main substrate 2001 of the electronic system 2000, which is shown in FIG. 12, via a plurality of conductive connection units 2800.

Each of the plurality of semiconductor chips 2200 may include a semiconductor substrate 3010, a first structure 3100, and a second structure 3200, the first structure 3100 and the second structure 3200 being sequentially stacked on the semiconductor substrate 3010 in the stated order. The first structure 3100 may include a peripheral circuit area including a plurality of peripheral wiring lines 3110. The first structure 3100 may include a plurality of transistor areas LVR, MVR, and HVR classified according to operation voltages of transistors, as described with reference to FIGS. 7B and 7C. As described with reference to FIG. 7C, the first transistor TR1 and the second transistor TR2, each having a planar channel structure in which a channel is formed along the top surface of the peripheral circuit substrate 210, may be formed in the first transistor area LVR and the second transistor area MVR, which include transistors having relatively low operation voltages and intermediate operation voltages, respectively. The third transistor TR3 having a recess channel structure, in which a channel is formed along the surface of the recess trench 210R in the peripheral circuit substrate 210, may be formed in the third transistor area HVR including transistors having relatively high operation voltages. Although FIG. 13 illustrates an example in which the first structure 3100 has the same structure as the peripheral circuit area PERI of the semiconductor device 100 shown in FIG. 7C, the inventive concept is not limited thereto. For example, the first structure 3100 may have the same structure as the peripheral circuit area PERI of the semiconductor device 400 shown in FIG. 9 or the peripheral circuit area PERI of the semiconductor device 500 shown in FIG. 10.

The second structure 3200 may include a common source line 3205, a gate stack 3210 on the common source line 3205, a channel structure 3220 penetrating the gate stack 3210, and a bit line 3240 electrically connected to the channel structure 3220. The gate stack 3210 may include the gate stack GS shown in FIG. 7B. As shown in FIG. 7B, the gate stack GS may include the plurality of gate lines 130 and the plurality of conductive pad regions 112 integrally connected to the plurality of gate lines 130. In addition, each of the plurality of semiconductor chips 2200 may include the plurality of contact structures CTS electrically connected to the plurality of conductive pad regions 112 of the gate stack GS.

Each of the plurality of semiconductor chips 2200 may include a through-wiring line 3245, which is electrically connected to the plurality of peripheral wiring lines 3110 of the first structure 3100 and extends into the second structure 3200. The through-wiring line 3245 may be arranged outside the gate stack 3210. In other example embodiments, the semiconductor package 2003 may further include a through-wiring line penetrating the gate stack 3210. Each of the plurality of semiconductor chips 2200 may include an input/output pad (2210 of FIG. 12) electrically connected to the plurality of peripheral wiring lines 3110 of the first structure 3100.

Figure 14:
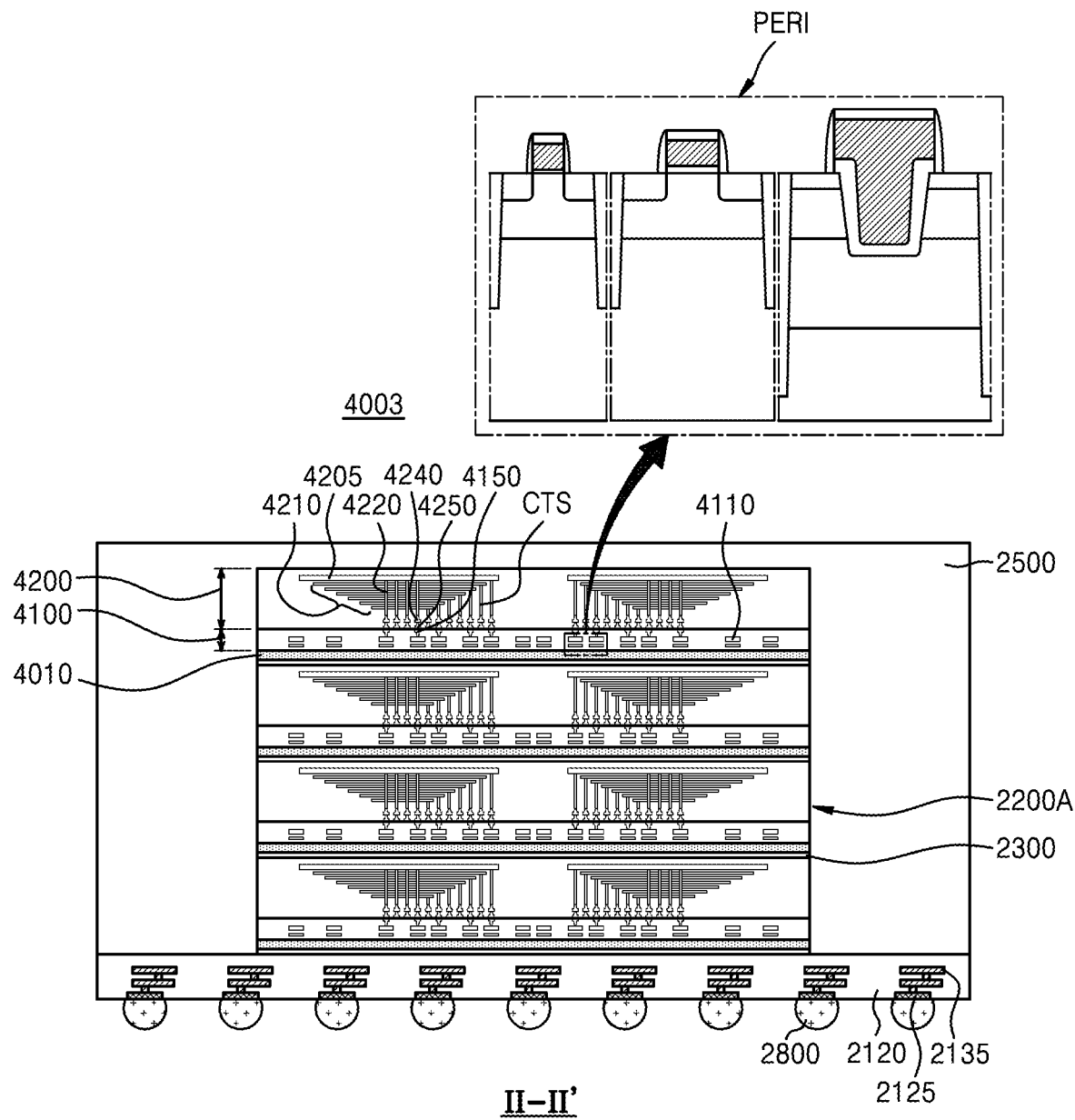
FIG. 14 is a schematic cross-sectional view illustrating semiconductor packages according to an embodiment of the inventive concept.

FIG. 14 is a schematic cross-sectional view illustrating semiconductor packages according to an embodiment of the inventive concept. FIG. 14 illustrates a configuration corresponding to a cross-section taken along the line of FIG. 12.

Referring to FIG. 14, a semiconductor package 4003 has substantially the same configuration as the semiconductor package 2003 described with reference to FIG. 13. However, the semiconductor package 4003 includes a plurality of semiconductor chips 2200A. Each of the plurality of semiconductor chips 2200A may include a semiconductor substrate 4010, a first structure 4100 on the semiconductor substrate 4010, and a second structure 4200 arranged on the first structure 4100 and bonded to the first structure 4100 in a wafer bonding manner.

The first structure 4100 may include a peripheral circuit area including a peripheral wiring line 4110 and a plurality of first bonding structures 4150. The first structure 4100 may include the plurality of transistor areas LVR, MVR, and HVR classified according to operation voltages of transistors, as described with reference to FIGS. 7B and 7C. As described with reference to FIG. 7C, the first transistor TR1 and the second transistor TR2, each having a planar channel structure in which a channel is formed along the top surface of the peripheral circuit substrate 210, may be formed in the first transistor area LVR and the second transistor area MVR, respectively, which include transistors having relatively low operation voltages or intermediate operation voltages. The third transistor TR3 having a recess channel structure, in which a channel is formed along the surface of the recess trench 210R in the peripheral circuit substrate 210, may be formed in the third transistor area HVR including transistors having relatively high operation voltages. Although FIG. 14 illustrates an example in which the first structure 4100 has the same structure as the peripheral circuit area PERI of the semiconductor device 100 shown in FIG. 7C, the inventive concept is not limited thereto. For example, the first structure 4100 may have the same structure as the peripheral circuit area PERI of the semiconductor device 400 shown in FIG. 9 or the peripheral circuit area PERI of the semiconductor device 500 shown in FIG. 10.

The second structure 4200 may include a common source line 4205, a gate stack 4210 between the common source line 4205 and the first structure 4100, and a channel structure 4220 penetrating the gate stack 4210. The gate stack 4210 may include the gate stack GS shown in FIG. 7B. As shown in FIG. 7B, the gate stack GS may include the plurality of gate lines 130 and the plurality of conductive pad regions 112 integrally connected to the plurality of gate lines 130. In addition, each of the plurality of semiconductor chips 2200A may include the plurality of contact structures CTS electrically connected to the plurality of conductive pad regions 112 of the gate stack GS.

Further, each of the plurality of semiconductor chips 2200A may include a plurality of second bonding structures 4250 electrically connected to respective gate lines 130 (see FIG. 7B) of the gate stack 4210. In example embodiments, the plurality of second bonding structures 4250 may include a plurality of bonding structures BS shown in FIG. 7B. For example, some second bonding structures 4250 among the plurality of second bonding structures 4250 may be connected to a bit line 4240 electrically connected to the channel structure 4220. Some other second bonding structures 4250 among the plurality of second bonding structures 4250 may be electrically connected to the gate line 130 (see FIG. 7B) via a contact structure CTS.

The plurality of first bonding structures 4150 of the first structure 4100 may be brought into contact with and bonded to the plurality of second bonding structures 4250 of the second structure 4200, respectively. Bonded portions of the plurality of first bonding structures 4150 and the plurality of second bonding structures 4250 may include, but are not limited to, a metal, for example, copper (Cu).

In example embodiments, connections between the plurality of semiconductor chips 2200 shown in FIG. 13, and connections between the plurality of semiconductor chips 2200A shown in FIG. 14 may be made by the plurality of connection structures 2400 (see FIG. 12) of a bonding wire type. In other example embodiments, connections between the plurality of semiconductor chips 2200 shown in FIG. 13, and connections between the plurality of semiconductor chips 2200A shown in FIG. 14 may be made, in an electrical manner, by a connection structure including a TSV.

Figure 15:
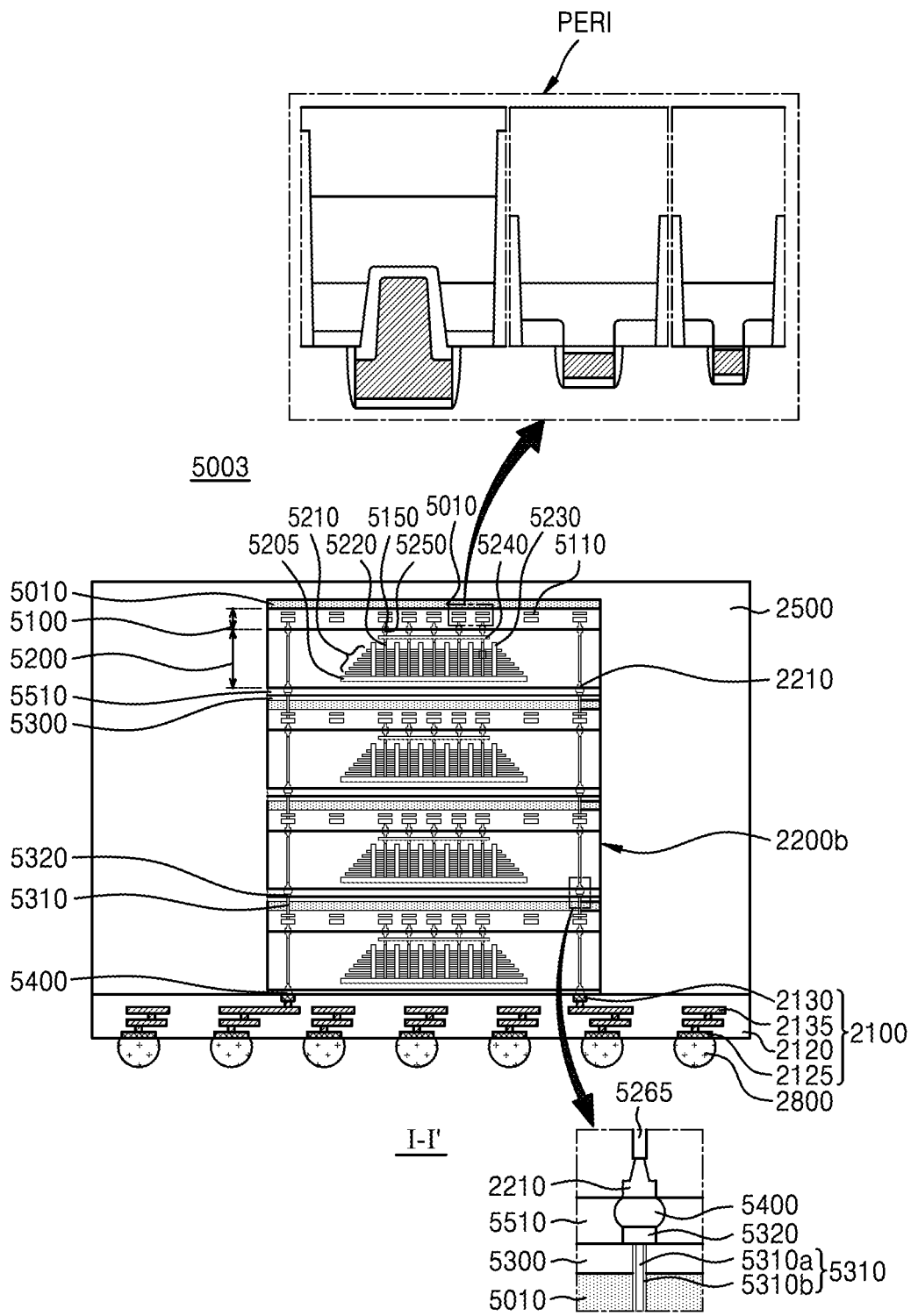
FIG. 15 is a schematic cross-sectional view illustrating semiconductor packages according to another embodiment of the inventive concept.

FIG. 15 is a schematic cross-sectional view illustrating semiconductor packages according to another embodiment of the inventive concept. FIG. 15 illustrates a configuration corresponding to a cross-section taken along a line I-I' of FIG. 12, in more detail.

Referring to FIG. 15, in a semiconductor package 5003, semiconductor chips 2200b may be vertically aligned with each other, e.g., along respective sidewalls thereof. Each of the semiconductor chips 2200b may include a semiconductor substrate 5010, a first structure 5100 formed under the semiconductor substrate 5010, and a second structure 5200 arranged under the first structure 5100 and bonded to the first structure 5100 in a wafer bonding manner.

The first structure 5100 may include a peripheral circuit area including peripheral wiring lines 5110 and first bonding structures 5150. The first structure 5100 may include the plurality of transistor areas LVR, MVR, and HVR classified according to operation voltages of transistors, as described with reference to FIGS. 7B and 7C. As described with reference to FIG. 7C, the first transistor TR1 and the second transistor TR2, each having a planar channel structure in which a channel is formed along the top surface of the peripheral circuit substrate 210, may be formed in the first transistor area LVR and the second transistor area MVR, respectively, which include transistors having relatively low operation voltages or intermediate operation voltages. The third transistor TR3 having a recess channel structure, in which a channel is formed along the surface of the recess trench 210R in the peripheral circuit substrate 210, may be formed in the third transistor area HVR including transistors having relatively high operation voltages. Although FIG. 15 illustrates an example in which the first structure 5100 has the same structure as the peripheral circuit area PERI of the semiconductor device 100 shown in FIG. 7C, the inventive concept is not limited thereto. For example, the first structure 5100 may have the same structure as the peripheral circuit area PERI of the semiconductor device 400 shown in FIG. 9 or the peripheral circuit area PERI of the semiconductor device 500 shown in FIG. 10.

The second structure 5200 may include a common source line 5205, a gate stack structure 5210 between the common source line 5205 and the first structure 5100, memory channel structures 5220 and isolation structures 5230 both penetrating the gate stack structure 5210, and second bonding structures 5250 electrically connected to the memory channel structures 5220 and to the plurality of gate lines 130 (see FIG. 7B) of the gate stack structure 5210. In example embodiments, a plurality of second bonding structures 5250 may include the plurality of bonding structures BS shown in FIG. 7B. For example, some second bonding structures 5250 among the plurality of second bonding structures 5250 may be connected to a bit line 5240 electrically connected to a channel structure 5220. Some other second bonding structures 5250 among the plurality of second bonding structures 5250 may be electrically connected to the gate line 130 (see FIG. 7B) via the contact structure CTS.

The first bonding structures 5150 of the first structure 5100 may be brought into contact with and bonded to the second bonding structures 5250 of the second structure 5200, respectively. Bonded portions of the plurality of first bonding structures 5150 and the plurality of second bonding structures 5250 may include, but are not limited to, a metal, for example, copper (Cu).

Among the semiconductor chips 2200b, the remaining semiconductor chips except the uppermost semiconductor chip may each further include a backside insulating layer 5300 on the semiconductor substrate 5010, backside input/output pads 5320 on the backside insulating layer 5300, and through-electrode structures 5310, which penetrate the semiconductor substrate 5010 and the backside insulating layer 5300 and electrically connect the peripheral wiring lines 5110 to the backside input/output pads 5320. Each of the through-electrode structures 5310 may include a through-electrode 5310a and an insulating spacer 5310b surrounding a side surface of the through-electrode 5310a. The semiconductor package 5003 may further include connection structures 5400, for example, conductive bumps, which are arranged under each of the semiconductor chips 2200b. The connection structures 5400 may electrically connect the semiconductor chips 2200b to each other and may electrically connect the semiconductor chips 2200b to the package substrate 2100. An underfill material layer 5510 may surround side surfaces of the connection structures 5400.

FIGS. 16A to 16F are cross-sectional views illustrating processes of a method of fabricating a semiconductor device, according to embodiments of the inventive concept. In the present example, descriptions are made by taking, as an example, a method of fabricating the semiconductor device 100 shown in FIGS. 7A to 7C. In FIGS. 16A to 16E, a configuration shown in the memory cell area MEC represents a configuration corresponding to a cross-section taken along a line A1-A1' of FIG. 7A, in each of the processes, and a configuration shown in the connection area CON represents a configuration corresponding to a cross-section taken along a line A2-A2' of FIG. 7A, in each of the processes.

Figure 16A:
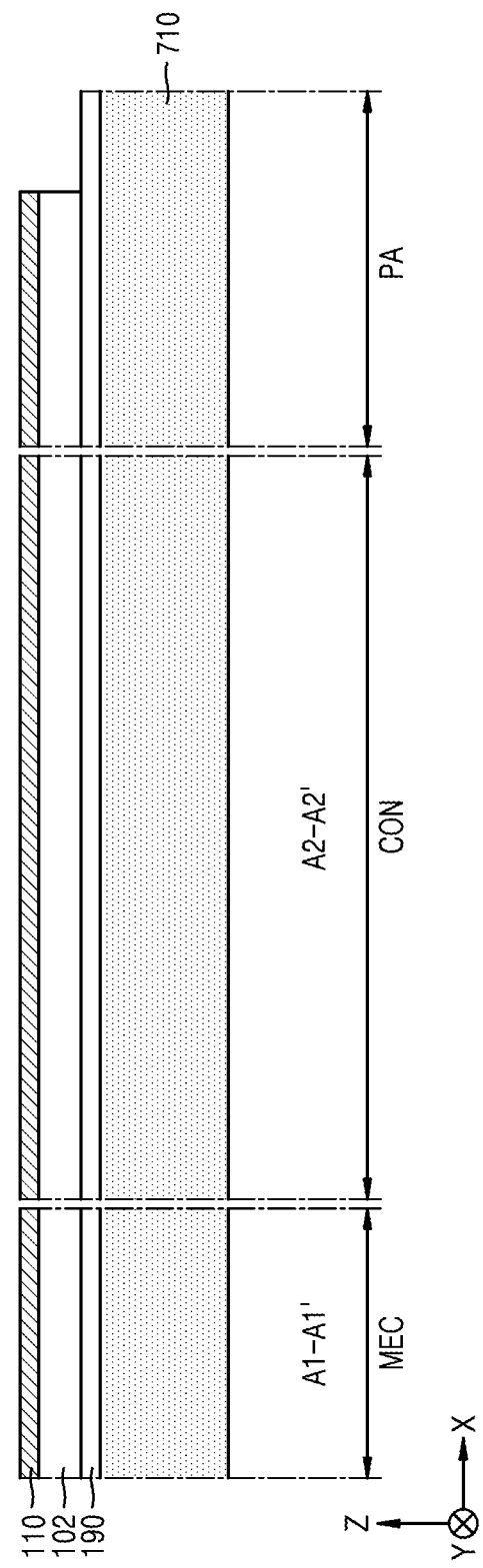
FIGS. 16A, 16B, 16C, 16D, 16E, and 16F are cross-sectional views illustrating processes of a method of fabricating a semiconductor device, according to embodiments of the inventive concept.

Referring to FIG. 16A, the cell insulating film 190 may be formed on a base substrate 710, and the cell substrate 102 and the conductive plate 110 may be sequentially formed or otherwise provided on the cell insulating film 190 in the stated order. The base substrate 710 may include a semiconductor substrate such as a silicon substrate.

Figure 16B:
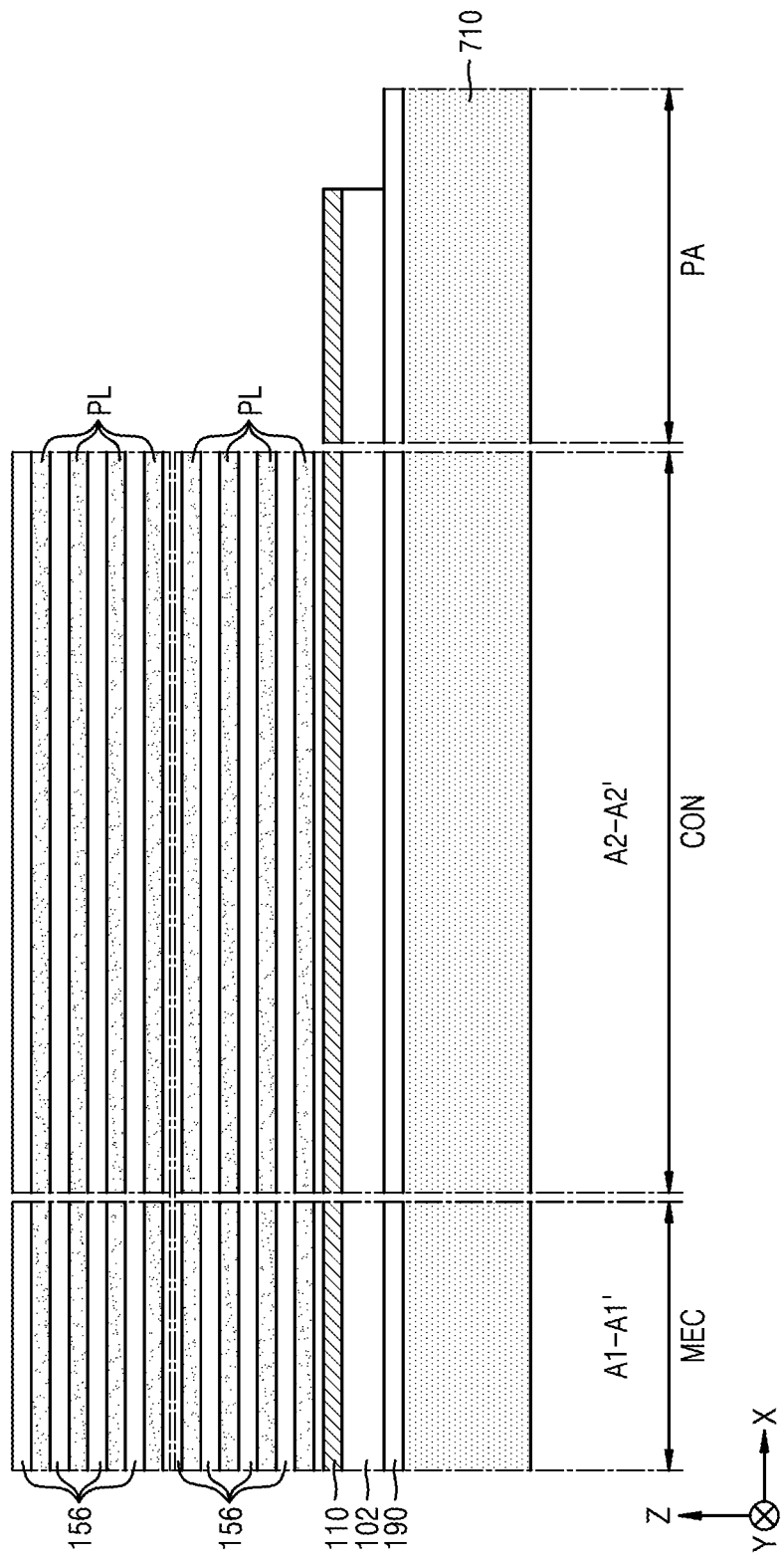

Referring to FIG. 16B, in the memory cell area MEC and the connection area CON, the plurality of insulating films 156 and a plurality of sacrificial films PL may be alternately stacked, one by one, on the conductive plate 110. The plurality of sacrificial films PL may include silicon nitride, silicon carbide, or polysilicon. Each of the plurality of sacrificial films PL may function to secure a space for forming the gate stack GS (see FIG. 16D) in subsequent processes.

Figure 16C:
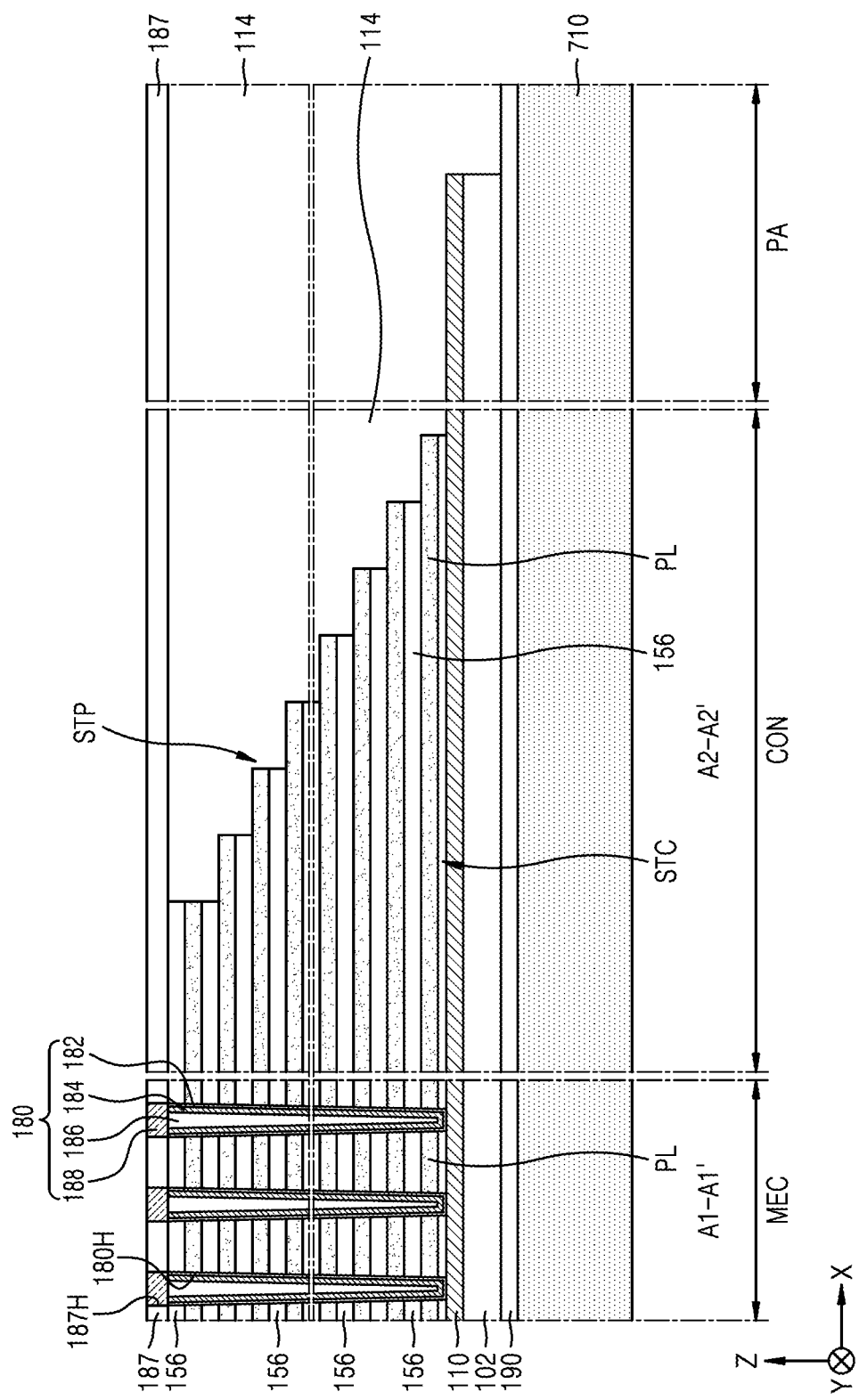

Referring to FIG. 16C, the plurality of insulating films 156 and the plurality of sacrificial films PL may each be partially removed such that the plurality of insulating films 156 and the plurality of sacrificial films PL form a step-like structure STP in the connection area CON, and then, the insulating film 114 may be formed to cover the step-like structure STP in the connection area CON. The insulating film 114 may be formed to cover the cell insulating film 190, the cell substrate 102, and the conductive plate 110 in the pad bonding area PA.

A plurality of channel holes 180H is formed through the plurality of insulating films 156 and the plurality of sacrificial films PL in the memory cell area MEC to extend in the vertical direction (Z direction), and a plurality of channel hole filling structures are formed by forming the gate dielectric film 182, the channel region 184, and the filling insulating film 186 in each of the plurality of channel holes 180H.

The intermediate insulating film 187 is formed to cover the plurality of channel hole filling structures, the step-like structure STP, and the insulating film 114 in the memory cell area MEC, the connection area CON, and the pad bonding area PA, top surfaces of the plurality of channel hole filling structures are exposed by forming a plurality of contact holes 187H in the intermediate insulating film 187, and the channel structure 180 is formed by forming the plurality of drain regions 188 in the plurality of contact holes 187H. The intermediate insulating film 187 may be formed to have a top surface planarized throughout the memory cell area MEC, the connection area CON, and the pad bonding area PA.

Figure 16D:
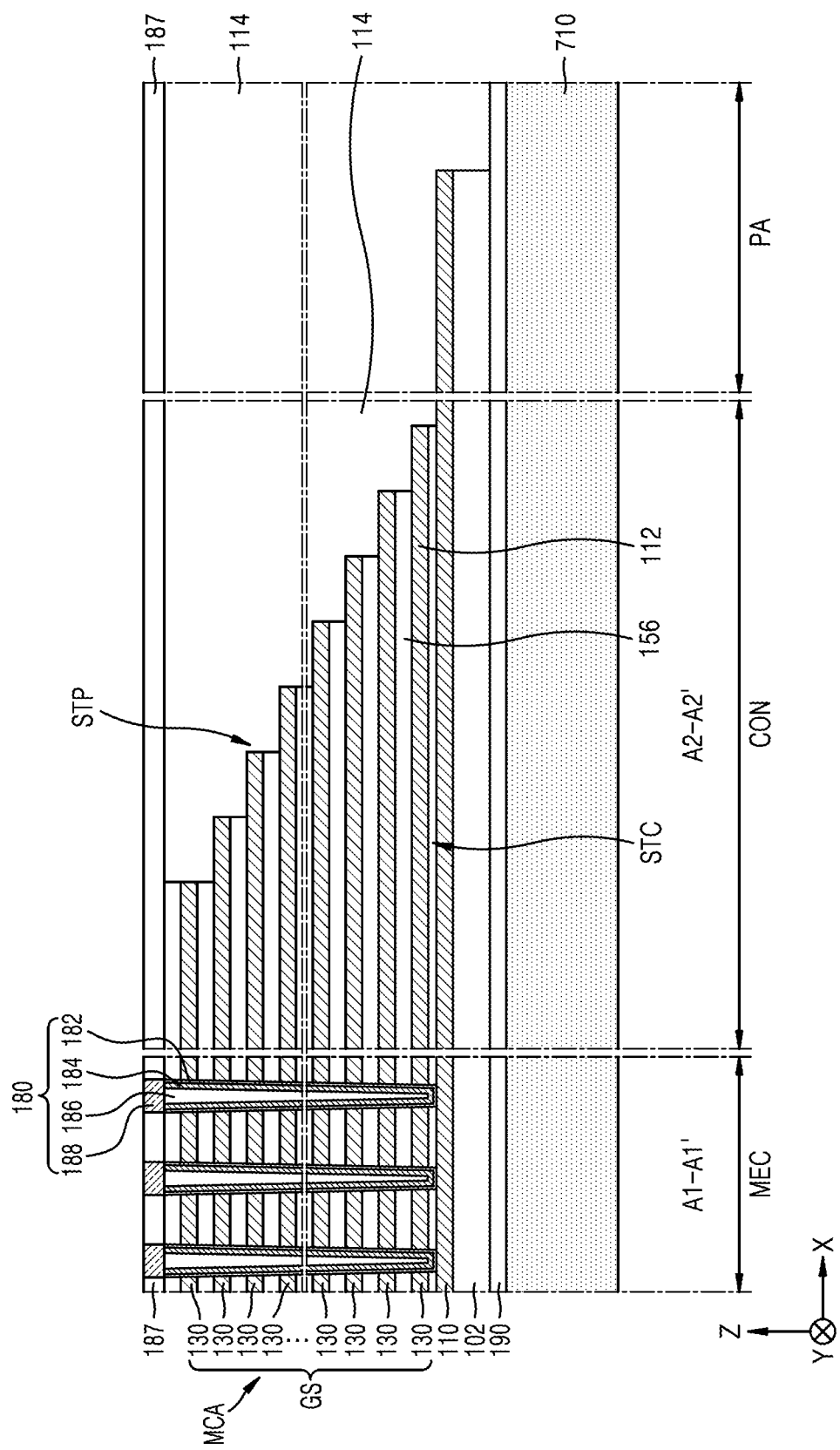

Referring to FIG. 16D, the plurality of word line cut regions WLC (see FIG. 7A) are formed through the plurality of insulating films 156 and the plurality of sacrificial films PL in a resulting structure of FIG. 16C to expose the conductive plate 110, and then, the plurality of sacrificial films PL are substituted with the plurality of gate lines 130 and the plurality of conductive pad regions 112 via the plurality of word line cut regions WLC.

In example embodiments, to substitute the plurality of sacrificial films PL (see FIG. 16B) with the plurality of gate lines 130, empty spaces between the plurality of insulating films 156 may be prepared by selectively removing the plurality of sacrificial films PL (see FIG. 16C) exposed by the plurality of word line cut regions WLC (see FIG. 7A), and then, the plurality of gate lines 130 and the plurality of conductive pad regions 112 may be formed by filling a conductive material in the empty spaces.

As shown in FIG. 7A, the word line cut structure WCS may be formed by forming the insulating spacer 192 and the common source line CSL in each of the plurality of word line cut regions WLC. In other example embodiments, the plurality of word line cut regions WLC may be filled with an insulating material, and a process of forming the common source line CSL may be omitted.

Figure 16E:
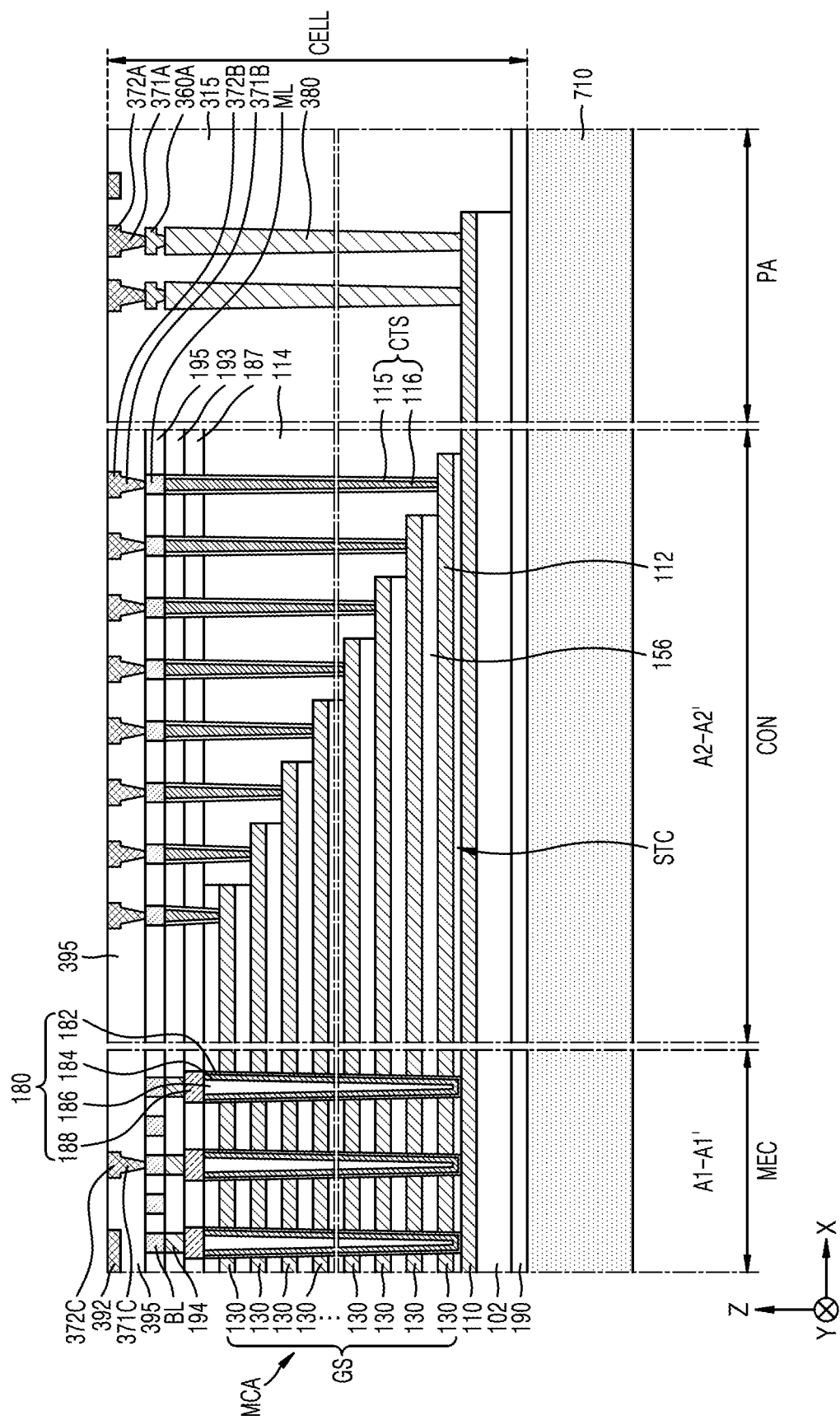

Referring to FIG. 16E, the upper insulating film 193 is formed on a resulting structure of FIG. 16D, and the plurality of bit line contact pads 194 may be formed through the upper insulating film 193 in the memory cell area MEC and thus be connected to the plurality of channel structures 180. The insulating film 114, the intermediate insulating film 187, and the upper insulating film 193 may constitute an insulating structure.

By anisotropically etching the insulating structure in the connection area CON and the pad bonding area PA by using a mask pattern (not shown) as an etch mask, a plurality of contact holes may be formed to expose the plurality of conductive pad regions 112 in the connection area CON and the conductive plate 110 in the pad bonding area PA. The contact structure CTS may be formed in each of the plurality of contact holes in the connection area CON, and a common source line contact plug 380 may be formed in each of the plurality of contact holes in the pad bonding area PA.

The interlayer dielectric 195 may be formed in the memory cell area MEC, the connection area CON, and the pad bonding area PA, and the plurality of bit lines BL may be formed through some regions of the interlayer dielectric 195 in the memory cell area MEC, the plurality of wiring layers ML may be formed through some regions of the interlayer dielectric 195 in the connection area CON, and the metal layer 360A may be formed through some regions of the interlayer dielectric 195 in the pad bonding area PA to be connected to the common source line contact plug 380.

A plurality of first bonding metal pads, which may be used to form the bonding structure BS (see FIG. 7B), may be formed. The plurality of first bonding metal pads may include the first bonding metal pads 371A, 372A, 371B, 372B, 371C, 372C, and 392 shown in FIG. 7B. During the processes of forming the first bonding metal pads 371A, 372A, 371B, 372B, 371C, 372C, and 392, the interlayer dielectric 395 may be formed in the memory cell area MEC and the connection area CON to surround each of the first bonding metal pads 371B, 372B, 371C, 372C, and 392. An insulating film may be formed in the pad bonding area PA to surround each of the first bonding metal pads 371A and 372A. Insulating films filling spaces between conductive patterns in the pad bonding area PA may remain as the interlayer dielectric 315. A resulting structure remaining on the base substrate 710 in FIG. 16E may constitute the cell area CELL.

Figure 16F:
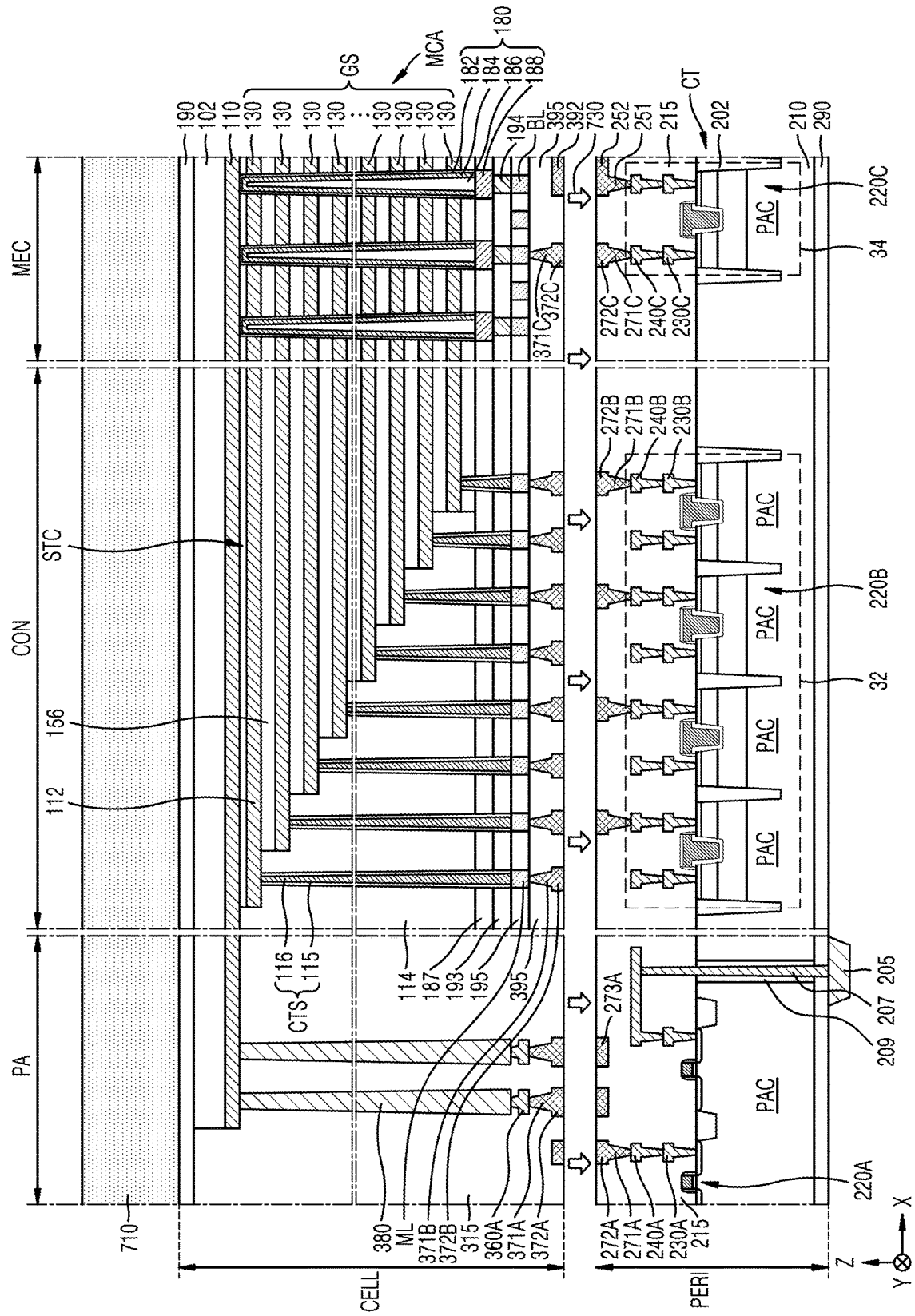

Referring to FIG. 16F, the peripheral circuit area PERI shown in FIG. 7B may be formed. The peripheral circuit area PERI may include a plurality of second bonding metal pads. The plurality of second bonding metal pads may include the second bonding metal pads 271A, 272A, 273A, 271B, 272B, 271C, 272C, and 252 shown in FIG. 7B.

A structure including the cell area CELL, which is the resulting structure of FIG. 16E, is stacked or otherwise arranged on the peripheral circuit area PERI to overlap the peripheral circuit area PERI in the vertical direction (Z direction), and the plurality of first bonding metal pads in the cell area CELL may be bonded to the plurality of second bonding metal pads in the peripheral circuit area PERI.

In example embodiments, the plurality of first bonding metal pads in the cell area CELL may be directly bonded to the plurality of second bonding metal pads in the peripheral circuit area PERI by pressurizing the structure including the cell area CELL in a direction of arrows 730, without a separate adhesion layer. For example, atomic-level bonds may be formed by pressurizing the plurality of first bonding metal pads and the plurality of second bonding metal pads in a direction toward each other while the plurality of first bonding metal pads face the plurality of second bonding metal pads, thereby forming the bonding structure BS (see FIG. 7B). In example embodiments, before bonding the plurality of first bonding metal pads to the plurality of second bonding metal pads, to improve a bonding strength therebetween, a process of performing surface treatment such as hydrogen plasma treatment on a surface of the cell area CELL, at which the plurality of first bonding metal pads are exposed, and a surface of the peripheral circuit area PERI, at which the plurality of second bonding metal pads are exposed, may be further performed.

The cell insulating film 190 may be exposed by removing the base substrate 710 from the cell area CELL. In example embodiments, to remove the base substrate 710, a grinding process, a wet etching process, or a combination thereof may be used.

Contact holes, which expose some of the plurality of first bonding metal pads, may be formed by partially removing each of the cell insulating film 190 and the interlayer dielectric 315 in the pad bonding area PA of the cell area CELL, the respective input/output contact plug 303 (see FIG. 7B) may be formed in each of the contact holes, and the respective input/output pad 305 (see FIG. 7B) may be formed on the cell insulating film 190, thereby fabricating the semiconductor device 100 described with reference to FIGS. 7A to 7C.

Although the method of fabricating the semiconductor device 100 shown in FIGS. 7A to 7C has been described with reference to FIGS. 16A to 16F, it will be understood by those of ordinary skill in the art that the semiconductor device 400 shown in FIG. 9 or the semiconductor device 500 shown in FIG. 10 may be fabricated by making various modifications and changes thereto without departing from the spirit and scope of the inventive concept.

Figure 17:
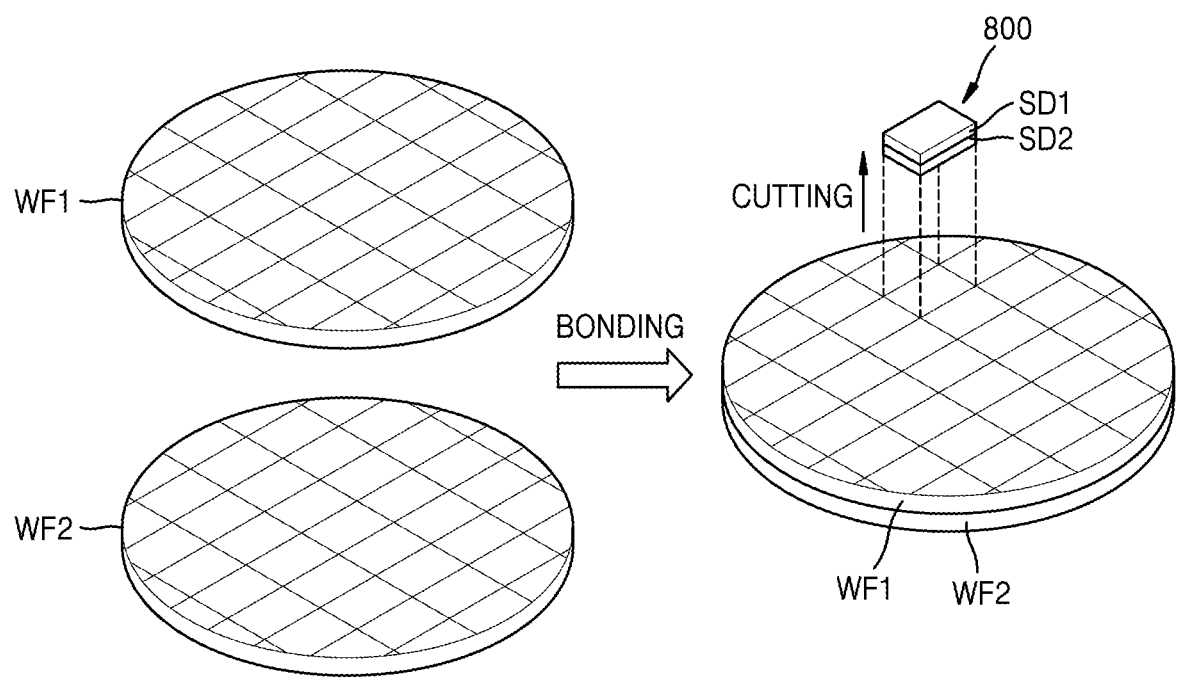
FIG. 17 is a diagram illustrating a method of fabricating a semiconductor device, according to other embodiments of the inventive concept.

FIG. 17 is a diagram illustrating a method of fabricating a semiconductor device, according to other embodiments of the inventive concept.

Referring to FIG. 17, a first structure including the cell area CELL described with reference to FIG. 7B may be formed on a first wafer WF1. A second structure including the peripheral circuit area PERI described with reference to FIG. 7B, 9, or 10 may be formed on a second wafer WF2.

The first wafer WF1 may be bonded to the second wafer WF2, and the first wafer WF1 and the second wafer WF2 may be cut while bonded to each other, thereby forming a plurality of chips 800.

Each of the plurality of chips 800 may include a first semiconductor die SD1 and a second semiconductor die SD2, which are stacked to overlap each other. The plurality of chips 800 may each include at least one of the semiconductor devices 100, 400, and 500 described with reference to FIGS. 7A to 10. The first semiconductor die SD1, which is obtained from the first wafer WF1, may include the cell area CELL described with reference to FIG. 7B. The second semiconductor die SD2, which is obtained from the second wafer WF2, may include the peripheral circuit area PERI described with reference to FIG. 7B, 7C, 9, or 10.

Figure 18:
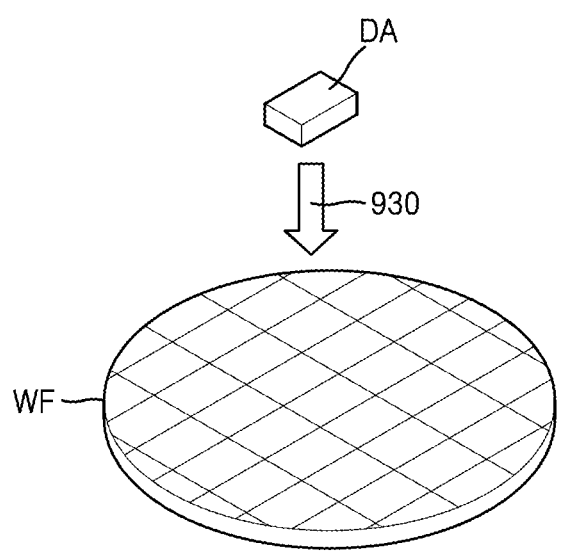
FIG. 18 is a diagram illustrating a method of fabricating a semiconductor device, according to yet other embodiments of the inventive concept.

FIG. 18 is a diagram illustrating a method of fabricating a semiconductor device, according to yet other embodiments of the inventive concept.

Referring to FIG. 18, a semiconductor die DA, which includes a first structure including the cell area CELL described with reference to FIG. 7B, may be formed. A second structure, which includes the peripheral circuit area PERI described with reference to FIG. 7B, 7C, 9, or 10, may be formed on a wafer WF. The semiconductor die DA may be bonded to some regions on the wafer WF by pressurizing the semiconductor die DA in a direction of arrow 930. The peripheral circuit area PERI described with reference to FIG. 7B, 7C, 9, or 10 may be arranged in a region of the wafer WF, which overlaps the semiconductor die DA.

Figure 19:
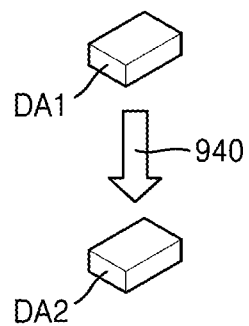
FIG. 19 is a diagram illustrating a method of fabricating a semiconductor device, according to yet other embodiments of the inventive concept.

FIG. 19 is a diagram illustrating a method of fabricating a semiconductor device, according to yet other embodiments of the inventive concept.

Referring to FIG. 19, a first semiconductor die DA1, which includes a first structure including the cell area CELL described with reference to FIG. 7B, may be formed. A second semiconductor die DA2, which includes a second structure including the peripheral circuit area PERI described with reference to FIG. 7B, 7C, 9, or 10, may be formed. The first semiconductor die DA1 may be bonded to the second semiconductor die DA2 by pressurizing the first semiconductor die DA1 in a direction of an arrow 940.

While the inventive concept has been particularly shown and described with reference to embodiments thereof, it will be understood that various changes in form and details may be made therein without departing from the spirit and scope of the following claims.

What is claimed is:

1. A semiconductor device comprising:
a cell area comprising a cell substrate, a memory cell array, and a first bonding metal pad on the memory cell array, the memory cell array comprising a plurality of word lines stacked in a vertical direction on the cell substrate and a plurality of bit lines on the plurality of word lines; and
a peripheral circuit area having the cell area stacked thereon in the vertical direction, the peripheral circuit area comprising a peripheral circuit substrate, a plurality of circuits on the peripheral circuit substrate, and a second bonding metal pad bonded to the first bonding metal pad,
wherein the plurality of circuits comprise:
a plurality of planar channel transistors respectively configured to form a channel along a top surface of the peripheral circuit substrate; and
at least one recess channel transistor configured to form a channel along a surface of a recess trench in the peripheral circuit substrate,
wherein the at least one recess channel transistor comprises first and second recess channel transistors,
the first recess channel transistor comprises a first gate electrode or a first source/drain region extending to a first depth in the vertical direction relative to the top surface of the peripheral circuit substrate, and
the second recess channel transistor comprises a second gate electrode or a second source/drain region extending to a second depth greater than the first depth in the vertical direction relative to the top surface of the peripheral circuit substrate.

2. The semiconductor device of claim 1, wherein an operation voltage of the at least one recess channel transistor is greater than respective operation voltages of the plurality of planar channel transistors.

3. The semiconductor device of claim 1, wherein:
the peripheral circuit area comprises a low-voltage transistor area including the plurality of planar channel transistors, and a high-voltage transistor area laterally adjacent the low-voltage transistor area and including the at least one recess channel transistor, the at least one recess channel transistor having an operation voltage greater than respective operation voltages of the plurality of planar channel transistors; and
the at least one recess channel transistor comprises a gate dielectric film on an inner wall of the recess trench, and the first or second gate electrode, the first or second gate electrode comprising a filling electrode portion on the gate dielectric film in the recess trench, and a protruding electrode portion integrally connected to the filling electrode portion and protruding from the top surface of the peripheral circuit substrate.

4. The semiconductor device of claim 1, wherein:
the peripheral circuit area further comprises a well in the peripheral circuit substrate having the recess trench therein;
the at least one recess channel transistor comprises a gate dielectric film on an inner wall of the recess trench, and a channel region in the well adjacent to a bottom of the recess trench; and
the gate dielectric film comprises a first portion adjacent to the inner wall and a second portion adjacent to the channel region, wherein a thickness of the first portion is greater than a thickness of the second portion.

5. The semiconductor device of claim 1, wherein:
the peripheral circuit area further comprises a pocket well of a first conductivity type in the peripheral circuit substrate having the recess trench therein, and a deep well of a second conductivity type under the pocket well;
the at least one recess channel transistor comprises a gate dielectric film on an inner wall of the recess trench, and a channel region in the pocket well adjacent to a bottom of the recess trench; and
the gate dielectric film comprises a first portion adjacent to the inner wall and a second portion adjacent to the channel region, wherein a thickness of the first portion is greater than a thickness of the second portion.

6. The semiconductor device of claim 1, wherein:
the peripheral circuit area comprises a low-voltage transistor area including the plurality of planar channel transistors, and a high-voltage transistor area laterally adjacent the low-voltage transistor area and including the at least one recess channel transistor, the at least one recess channel transistor having an operation voltage greater than respective operation voltages of the plurality of planar channel transistors; and
the first and second recess channel transistors are in the high-voltage transistor area, the first recess channel transistor having a first operation voltage and comprising the first gate electrode extending to the first depth in the vertical direction, and the second recess channel transistor having a second operation voltage greater than the first operation voltage and comprising the second gate electrode extending to the second depth in the vertical direction.

7. The semiconductor device of claim 1, wherein:
the peripheral circuit area comprises a low-voltage transistor area including the plurality of planar channel transistors, and a high-voltage transistor area laterally adjacent the low-voltage transistor area and including the at least one recess channel transistor, the at least one recess channel transistor having an operation voltage greater than respective operation voltages of the plurality of planar channel transistors; and
the first and second recess channel transistors are in the high-voltage transistor area, the first recess channel transistor having a first operation voltage and comprising the first source/drain region including a first impurity region and a second impurity region, the first impurity region extending to the first depth and having a first dopant concentration and the second impurity region having a second dopant concentration greater than the first dopant concentration, the second recess channel transistor having a second operation voltage greater than the first operation voltage and comprising the second source/drain region including a third impurity region and a fourth impurity region, the third impurity region extending to the second depth and having a third dopant concentration and the fourth impurity region having a fourth dopant concentration greater than the third dopant concentration.

8. The semiconductor device of claim 1, wherein:
an operation voltage of the at least one recess channel transistor is greater than respective operation voltages of the plurality of planar channel transistors;
the plurality of planar channel transistors comprise a first planar channel transistor having a first operation voltage and a second planar channel transistor having a second operation voltage greater than the first operation voltage;
the first planar channel transistor comprises a first gate electrode having a first width in a first horizontal direction; and
the second planar channel transistor comprises a second gate electrode having a second width greater than the first width in the first horizontal direction.

9. The semiconductor device of claim 1, wherein the peripheral circuit area comprises:
a first transistor area including a first planar channel transistor among the plurality of planar channel transistors, the first planar channel transistor having a first operation voltage;
a second transistor area including a second planar channel transistor among the plurality of planar channel transistors, the second planar channel transistor having a second operation voltage greater than the first operation voltage; and
a third transistor area including the at least one recess channel transistor, the at least one recess channel transistor having a third operation voltage greater than the second operation voltage,
wherein the first operation voltage is about 0.5 V to about 1.2 V, the second operation voltage is greater than about 1.2 V and less than about 10 V, and the third operation voltage is about 10 V or more.

10. A semiconductor device comprising:
a cell area comprising a memory cell array; and
a peripheral circuit area having the cell area stacked thereon in a vertical direction, the peripheral circuit area comprising a peripheral circuit substrate and a plurality of circuits on the peripheral circuit substrate and electrically connected to the memory cell array,
wherein the plurality of circuits comprise:
a plurality of planar channel transistors respectively configured to form a channel along a top surface of the peripheral circuit substrate; and
at least one recess channel transistor configured to form a channel along a surface of a recess trench in the peripheral circuit substrate,
wherein the at least one recess channel transistor comprises:
a first recess channel transistor comprising a first gate electrode or a first source/drain region that has a first depth in the vertical direction relative to the top surface of the peripheral circuit substrate; and
a second recess channel transistor comprising a second gate electrode or a second source/drain region that has a second depth, which is greater than the first depth, in the vertical direction relative to the top surface of the peripheral circuit substrate.

11. The semiconductor device of claim 10, wherein an operation voltage of the at least one recess channel transistor is greater than respective operation voltages of the plurality of planar channel transistors.

12. The semiconductor device of claim 10, wherein the peripheral circuit area comprises:
a first transistor area including a first planar channel transistor among the plurality of planar channel transistors, the first planar channel transistor having a first operation voltage;
a second transistor area including a second planar channel transistor among the plurality of planar channel transistors, the second planar channel transistor having a second operation voltage greater than the first operation voltage; and
a third transistor area including the at least one recess channel transistor, the at least one recess channel transistor having a third operation voltage greater than the second operation voltage.

13. The semiconductor device of claim 10, wherein respective operation voltages of the plurality of planar channel transistors is less than about 10 V, and an operation voltage of the at least one recess channel transistor is about 10 V or more.

14. The semiconductor device of claim 10, wherein the cell area comprises a pad bonding area including one or more input/output pads, and a memory cell area including the memory cell array and arranged laterally adjacent to the pad bonding area, and
wherein the pad bonding area is stacked on the plurality of planar channel transistors, and the memory cell area is stacked on the at least one recess channel transistor.

15. The semiconductor device of claim 10, wherein:
the peripheral circuit area further comprises a well in the peripheral circuit substrate having the recess trench therein;
the at least one recess channel transistor comprises a gate dielectric film on an inner wall of the recess trench, impurity regions in the well, and a channel region in the well adjacent to a bottom of the recess trench; and
the gate dielectric film comprises a first portion adjacent to the inner wall and a second portion adjacent to the channel region, wherein a thickness of the first portion is greater than a thickness of the second portion.

16. The semiconductor device of claim 10, wherein:
the peripheral circuit area further comprises a pocket well of a first conductivity type in the peripheral circuit substrate having the recess trench therein, and a deep well of a second conductivity type under the pocket well;
the at least one recess channel transistor comprises a gate dielectric film on an inner wall of the recess trench, impurity regions in the pocket well, and a channel region in the pocket well adjacent to a bottom of the recess trench; and
the gate dielectric film comprises a first portion adjacent to the inner wall and a second portion adjacent to the channel region, wherein a thickness of the first portion is greater than a thickness of the second portion.

17. The semiconductor device of claim 10, wherein the at least one recess channel transistor has an operation voltage greater than respective operation voltages of the plurality of planar channel transistors,
the first recess channel transistor has a first operation voltage, and
the second recess channel transistor has a second operation voltage greater than the first operation voltage.

18. The semiconductor device of claim 10, wherein the at least one recess channel transistor has an operation voltage greater than respective operation voltages of the plurality of planar channel transistors,
the first recess channel transistor has a first operation voltage and comprises the first source/drain region including a first impurity region and a second impurity region, the first impurity region having the first depth and a first dopant concentration, and the second impurity region having a second dopant concentration greater than the first dopant concentration, and
the second recess channel transistor has a second operation voltage greater than the first operation voltage and comprises the second source/drain region including a third impurity region and a fourth impurity region, the third impurity region having the second depth and a third dopant concentration, and the fourth impurity region having a fourth dopant concentration greater than the third dopant concentration.

19. An electronic system comprising:
a main substrate;
a semiconductor device on the main substrate; and
a controller on the main substrate and electrically connected to the semiconductor device,
wherein the semiconductor device comprises:
a cell area comprising a memory cell array; and
a peripheral circuit area having the cell area stacked thereon in a vertical direction, the peripheral circuit area comprising a peripheral circuit substrate and a plurality of circuits on the peripheral circuit substrate and electrically connected to the memory cell array,
wherein the plurality of circuits comprise:
a plurality of planar channel transistors respectively configured to form a channel along a top surface of the peripheral circuit substrate; and
at least one recess channel transistor configured to form a channel along a surface of a recess trench in the peripheral circuit substrate,
wherein the at least one recess channel transistor comprises:
a first recess channel transistor comprising a first gate electrode and a first source/drain region including a first impurity region and a second impurity region, the first impurity region having a first dopant concentration, and the second impurity region having a second dopant concentration greater than the first dopant concentration; and
a second recess channel transistor comprising a second gate electrode and a second source/drain region including a third impurity region and a fourth impurity region, the third impurity region having a third dopant concentration, and the fourth impurity region having a fourth dopant concentration greater than the third dopant concentration,
wherein, in the vertical direction relative to the top surface of the peripheral circuit substrate, a depth of the second gate electrode or the third impurity region of the second recess channel transistor is greater than a depth of the first gate electrode or the first impurity region of the first recess channel transistor.

20. The electronic system of claim 19, wherein the main substrate further comprises wiring patterns electrically connecting the semiconductor device to the controller, and, in the semiconductor device, an operation voltage of the at least one recess channel transistor is greater than respective operation voltages of the plurality of planar channel transistors.

* * * * *